(12) United States Patent
Albers et al.

(10) Patent No.: US 10,854,590 B2
(45) Date of Patent: Dec. 1, 2020

(54) SEMICONDUCTOR DIE PACKAGE WITH MORE THAN ONE HANGING DIE

(71) Applicant: Intel IP Corporation, Santa Clara, CA (US)

(72) Inventors: Sven Albers, Regensburg (DE); Klaus Reingruber, Langquaid (DE); Richard Patten, Langquaid (DE); Georg Seidemann, Landshut (DE); Christian Geissler, Teugn (DE)

(73) Assignee: Intel IP Corporation, Santa Clara, CA (US)

( * ) Notice: Subject to any disclaimer, the term of this patent is extended or adjusted under 35 U.S.C. 154(b) by 254 days.

(21) Appl. No.: 15/776,378

(22) PCT Filed: Dec. 23, 2015

(86) PCT No.: PCT/EP2015/081130
§ 371 (c)(1),
(2) Date: May 15, 2018

(87) PCT Pub. No.: WO2017/108121
PCT Pub. Date: Jun. 29, 2017

(65) Prior Publication Data
US 2020/0176436 A1     Jun. 4, 2020

(51) Int. Cl.
*H01L 23/02* (2006.01)
*H01L 25/00* (2006.01)
(Continued)

(52) U.S. Cl.
CPC .......... *H01L 25/50* (2013.01); *H01L 25/0657* (2013.01); *H01L 2224/48227* (2013.01);
(Continued)

(58) Field of Classification Search
CPC ................. H01L 25/50; H01L 25/0657; H01L 2225/06513; H01L 2225/06572; H01L 2225/06589
(Continued)

(56) References Cited

U.S. PATENT DOCUMENTS

| 6,098,278 A | 8/2000 | Vindasius et al. |
| 2006/0046436 A1 | 3/2006 | Ohuchi et al. |

(Continued)

FOREIGN PATENT DOCUMENTS

| EP | 1168441 A2 | 1/2002 |
| TW | 201125073 | 7/2011 |
| TW | 201501227 | 1/2015 |

OTHER PUBLICATIONS

International Search Report and Written Opinion for International Patent Application No. PCT/EP2015/081130 dated Mar. 10, 2016, 14 pgs.

(Continued)

*Primary Examiner* — Ly D Pham
(74) *Attorney, Agent, or Firm* — Schwabe, Williamson & Wyatt, P.C.

(57) ABSTRACT

An apparatus is described that includes a semiconductor die package. The semiconductor die package includes a semiconductor die package substrate having a top side and a bottom side. The semiconductor die package includes I/O balls on the bottom side of the semiconductor die package substrate. The I/O balls are to mount to a planar board. The semiconductor die package includes a first semiconductor die mounted on the bottom side of the semiconductor die package substrate. The first semiconductor die is vertically located between the bottom side of the semiconductor die package substrate and a second semiconductor die that is a part of the semiconductor die package.

23 Claims, 33 Drawing Sheets

(51) Int. Cl.
*H01L 25/065* (2006.01)
*H05K 1/11* (2006.01)

(52) U.S. Cl.
CPC ............... *H01L 2224/97* (2013.01); *H01L 2225/06513* (2013.01); *H01L 2225/06572* (2013.01); *H01L 2225/06589* (2013.01); *H01L 2924/15311* (2013.01)

(58) Field of Classification Search
USPC .......................................................... 257/738
See application file for complete search history.

(56) References Cited

U.S. PATENT DOCUMENTS

| 2007/0001277 | A1* | 1/2007 | Ichikawa | .......... | H01L 23/49827 |
| | | | | | 257/676 |
| 2009/0052218 | A1 | 2/2009 | Kang | | |
| 2011/0018121 | A1 | 1/2011 | Lee et al. | | |
| 2011/0215458 | A1 | 9/2011 | Camacho et al. | | |
| 2012/0075807 | A1 | 3/2012 | Refai-Ahmed et al. | | |
| 2012/0211885 | A1* | 8/2012 | Choi | ................... | H01L 21/563 |
| | | | | | 257/737 |
| 2013/0001798 | A1 | 1/2013 | Choi | | |
| 2013/0161812 | A1 | 6/2013 | Kim et al. | | |
| 2018/0374795 | A1* | 12/2018 | Deguchi | ............... | H01L 23/535 |

OTHER PUBLICATIONS

International Preliminary Report on Patentability for International Patent Application No. PCT/EP2015/081130 dated Jul. 5, 2018, 9 pgs.

Office Action (7 pgs no translation) and Search Report (2 pgs w English translation) for Taiwan Patent Application No. 105138241 dated Feb. 10, 2020.

Office Action and Search Report for Taiwan Patent Application No. 105138241 dated Aug. 28, 2020, 12 pgs.

* cited by examiner

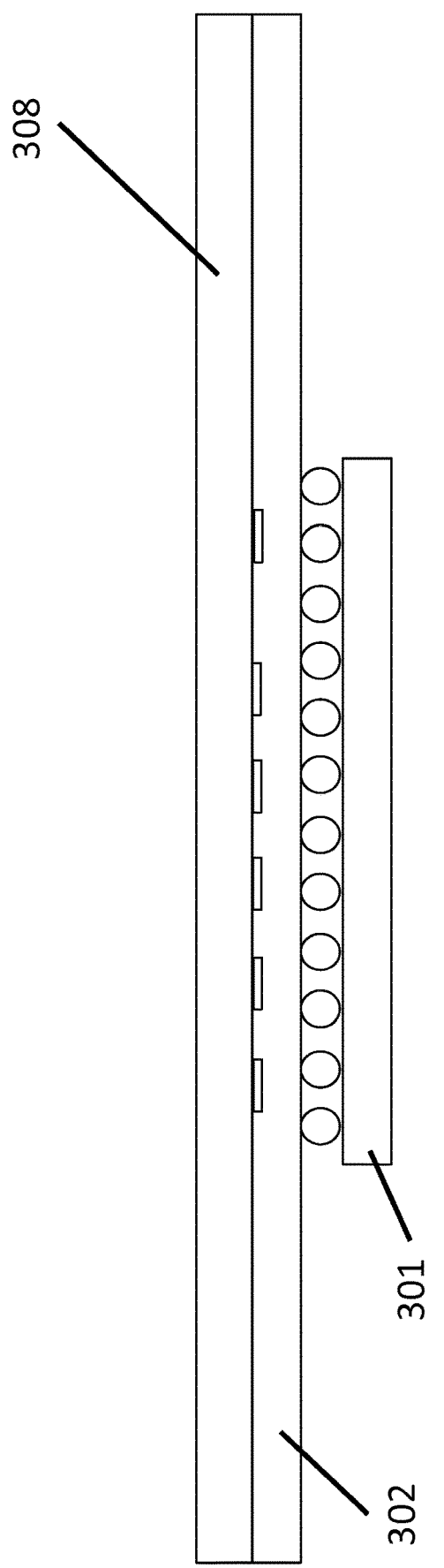

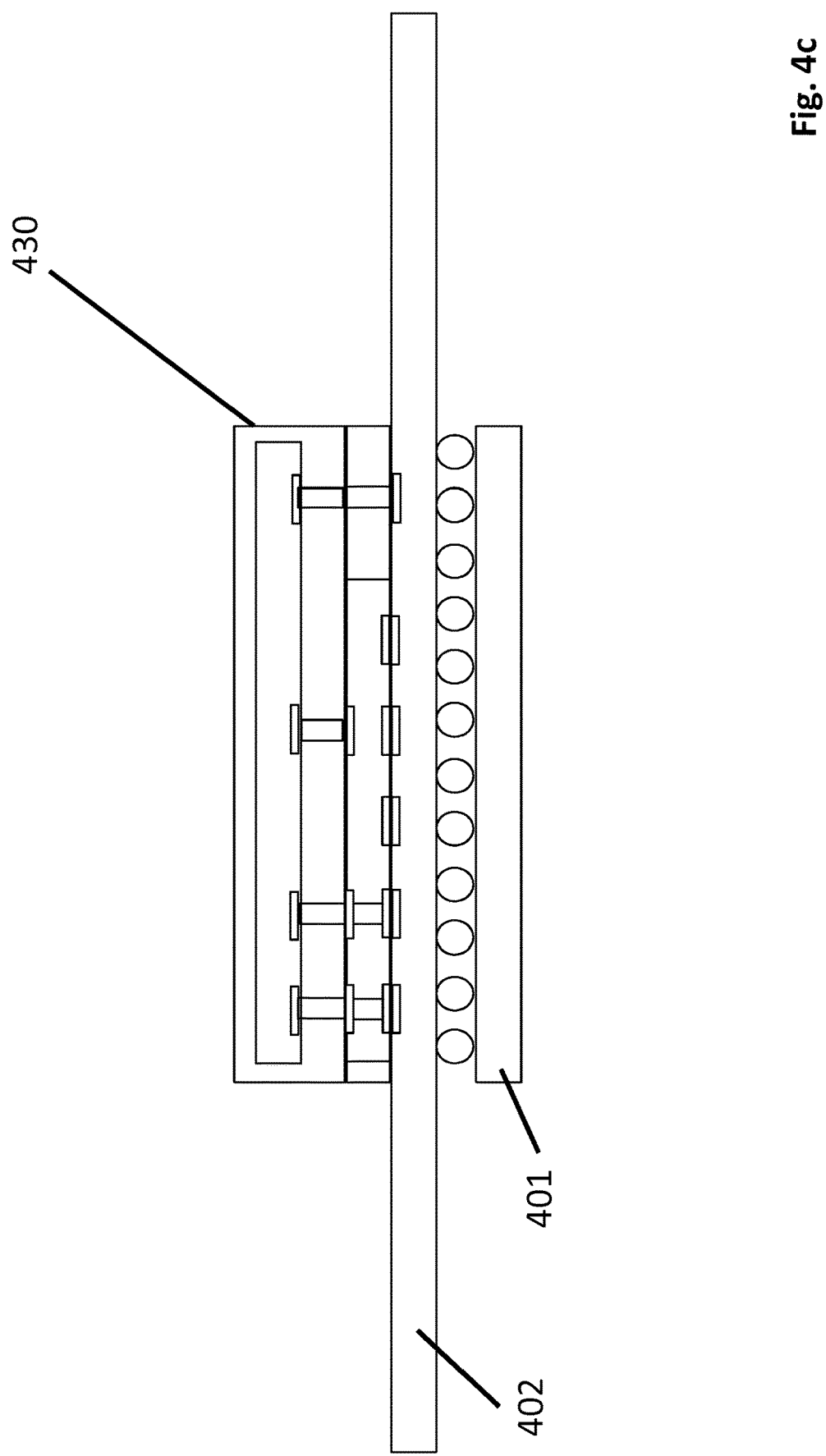

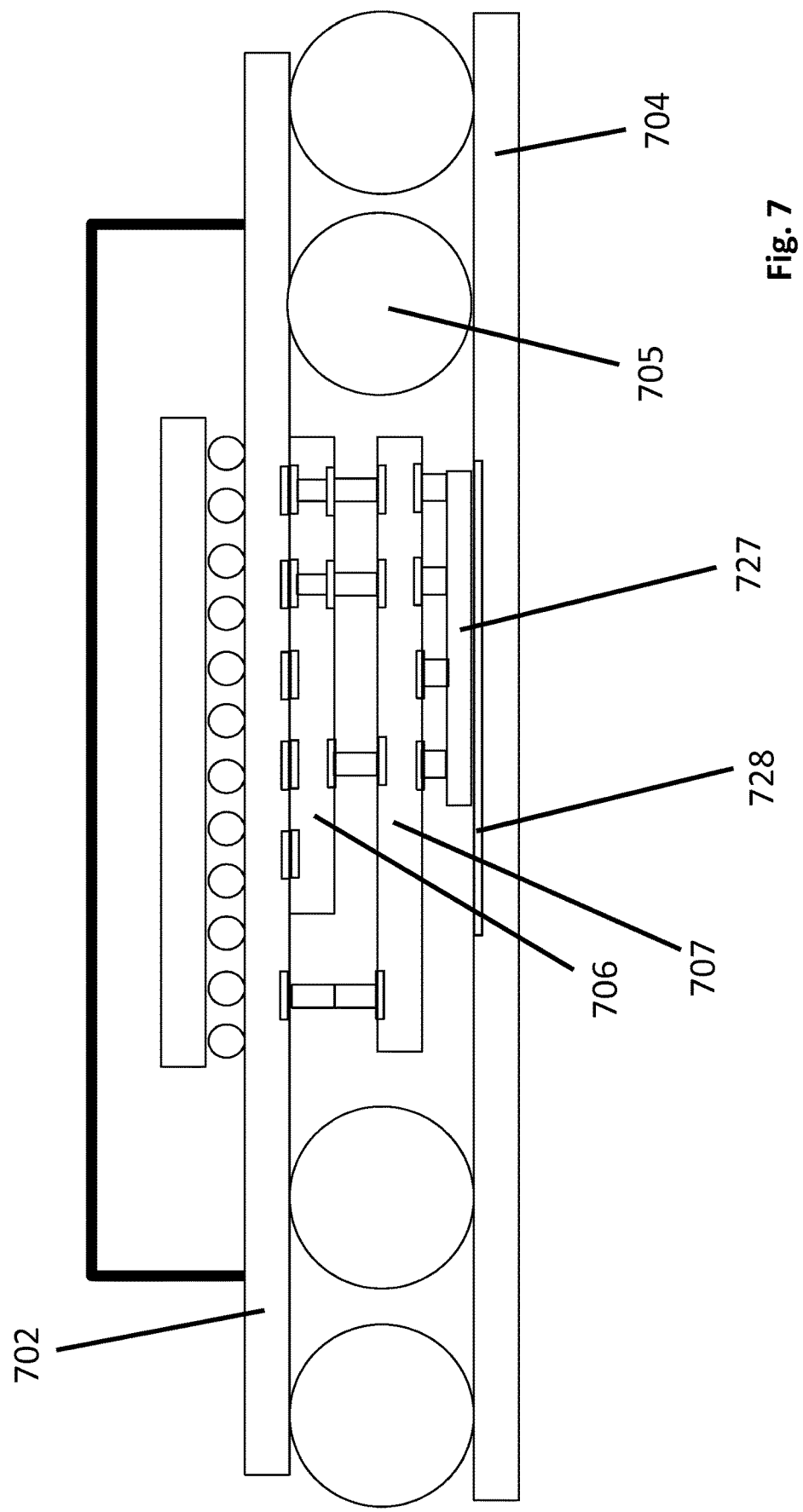

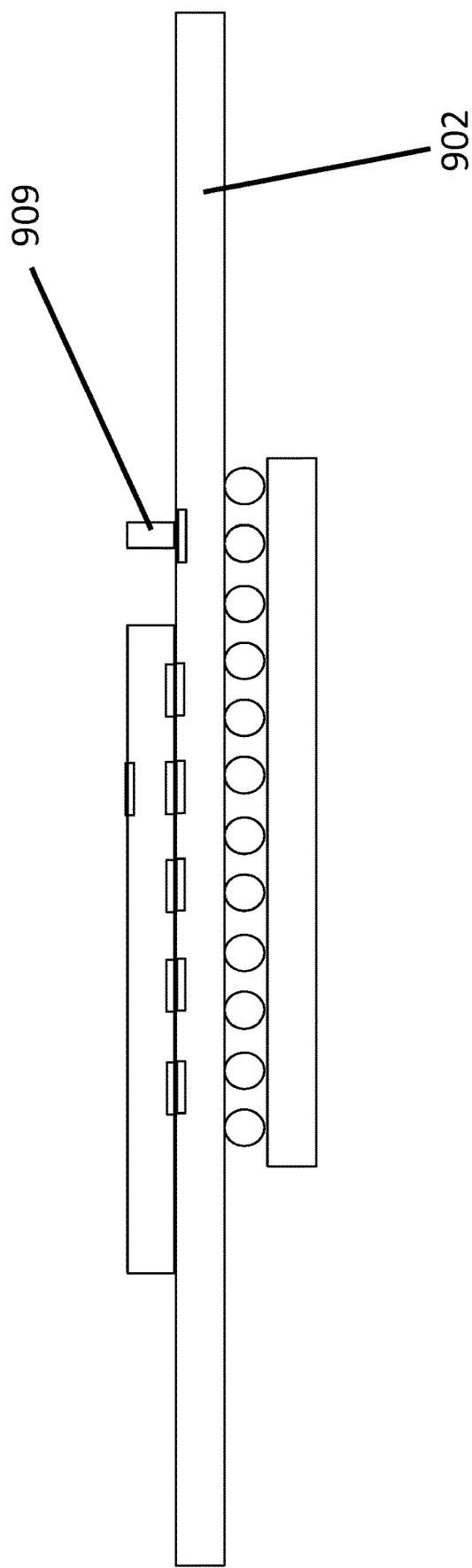

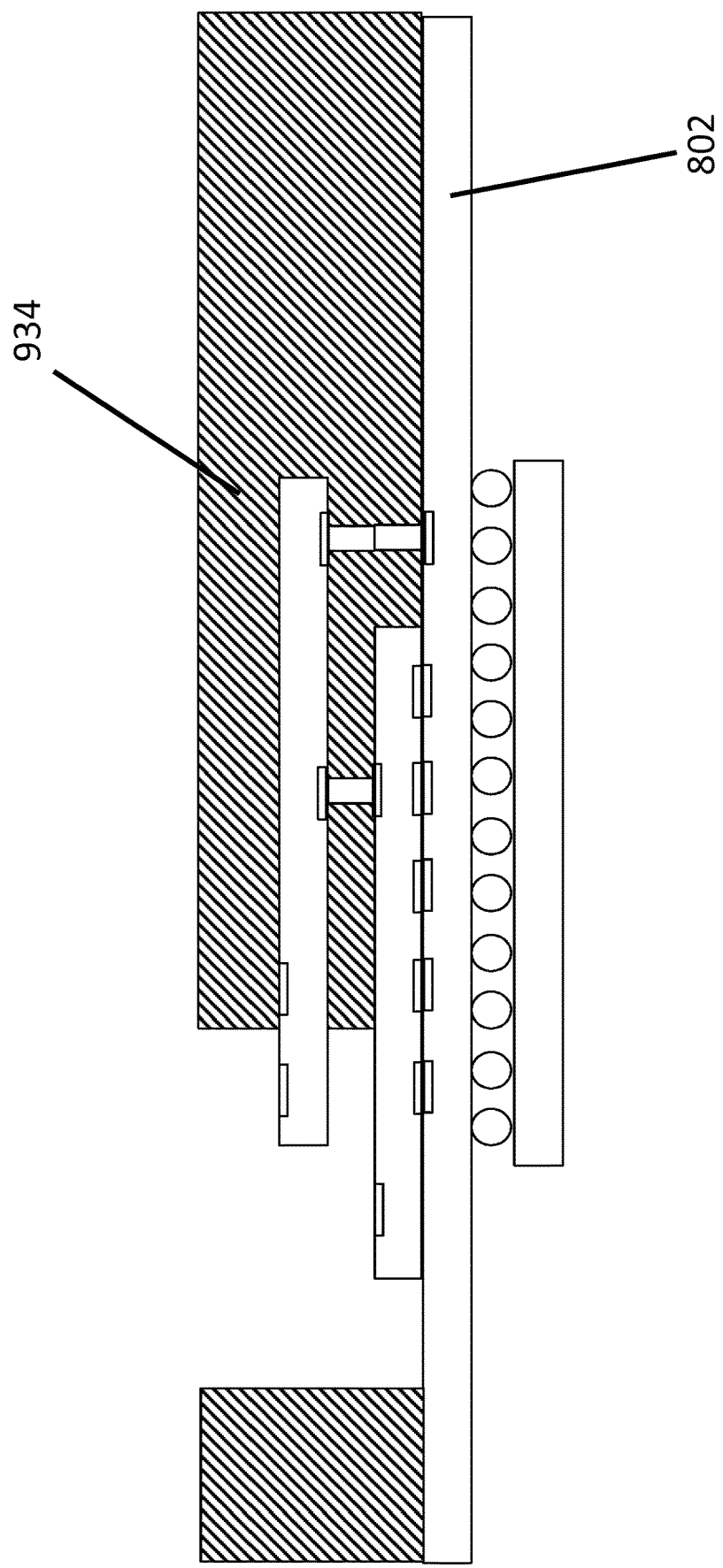

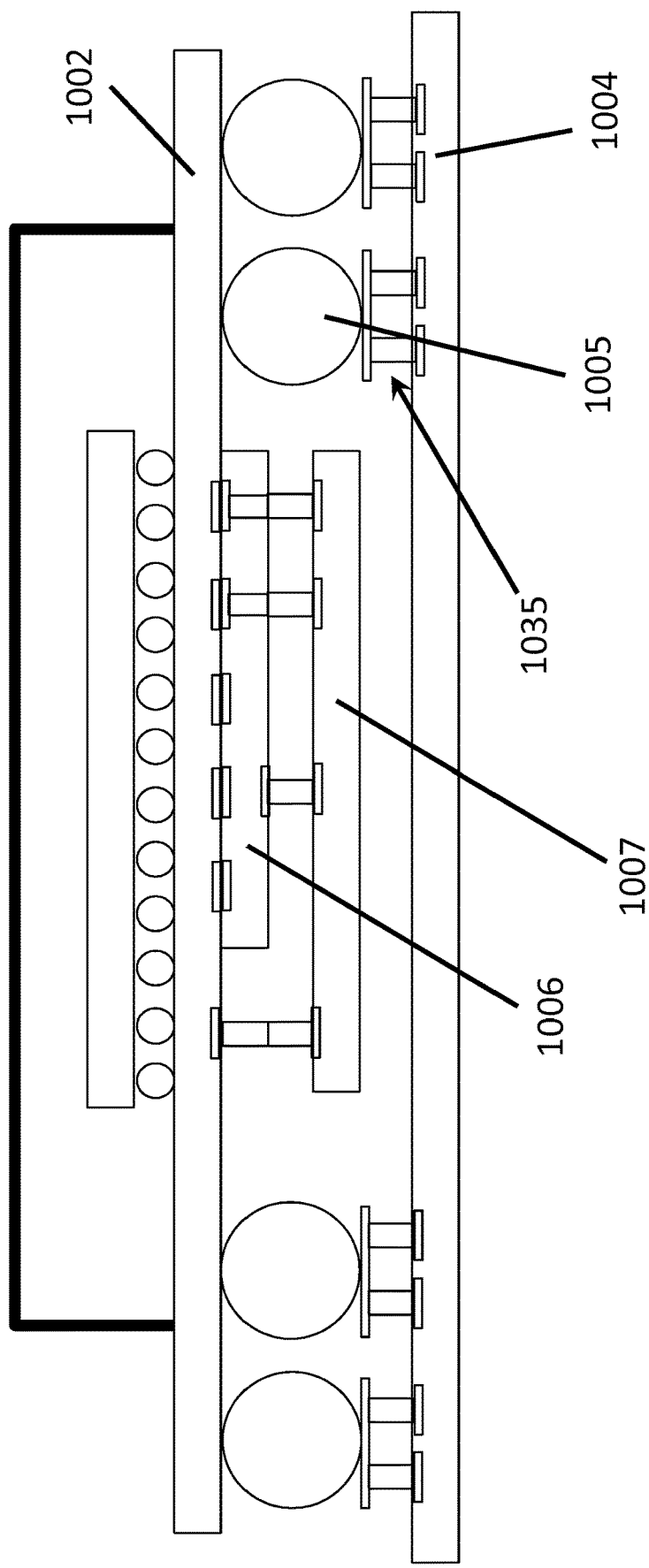

SEMICONDUCTOR DIE PACKAGE WITH MORE THAN ONE HANGING DIE

CROSS-REFERENCE TO RELATED APPLICATION

This patent application is a U.S. National Phase Application under 35 U.S.C. § 371 of International Application No. PCT/EP2015/081130, filed Dec. 23, 2015, entitled "SEMICONDUCTOR DIE PACKAGE WITH MORE THAN ONE HANGING DIE," which designates the United States of America, the entire disclosure of which is hereby incorporated by reference in its entirety and for all purposes.

FIELD OF INVENTION

The field of invention pertains generally to the semiconductor arts, and, more specifically, to a semiconductor die package with more than one hanging die.

BACKGROUND

The semiconductor arts has traditionally faced the challenge of attempting to integrate electronic functionality into as small a volume as possible. The packaging of electronic components therefore raises a number of challenges to effect incremental improvements in packing density of an overall electronic device or system.

FIG. 1 shows a prior art semiconductor die package 100 having a hanging die. As observed in FIG. 1, the package 100 includes a standard die package composed of a semiconductor die 101 mounted to a top side of a substrate 102. A lid 103 encapsulates the die 101. Solder balls 104 are located on the bottom side of the substrate 102. The solder balls 104 are mounted to a planar board (also referred to as a PC board) 105. In the space between the underside of the package substrate 102 and the top side of the planar board 105 resides a hanging die 106 that is mounted to the underside of the package substrate 102.

FIGURES

A better understanding of the present invention can be obtained from the following detailed description in conjunction with the following drawings, in which:

FIGS. 4a through 4c show another method of manufacturing the semiconductor die package of FIG. 2;

FIG. 7 shows a third semiconductor die package with more than one hanging die;

FIGS. 9a through 9d show a method of manufacturing the semiconductor die package of FIG. 8;

FIG. 10 shows a fifth semiconductor die package with more than one hanging die;

DETAILED DESCRIPTION

Figure 1:
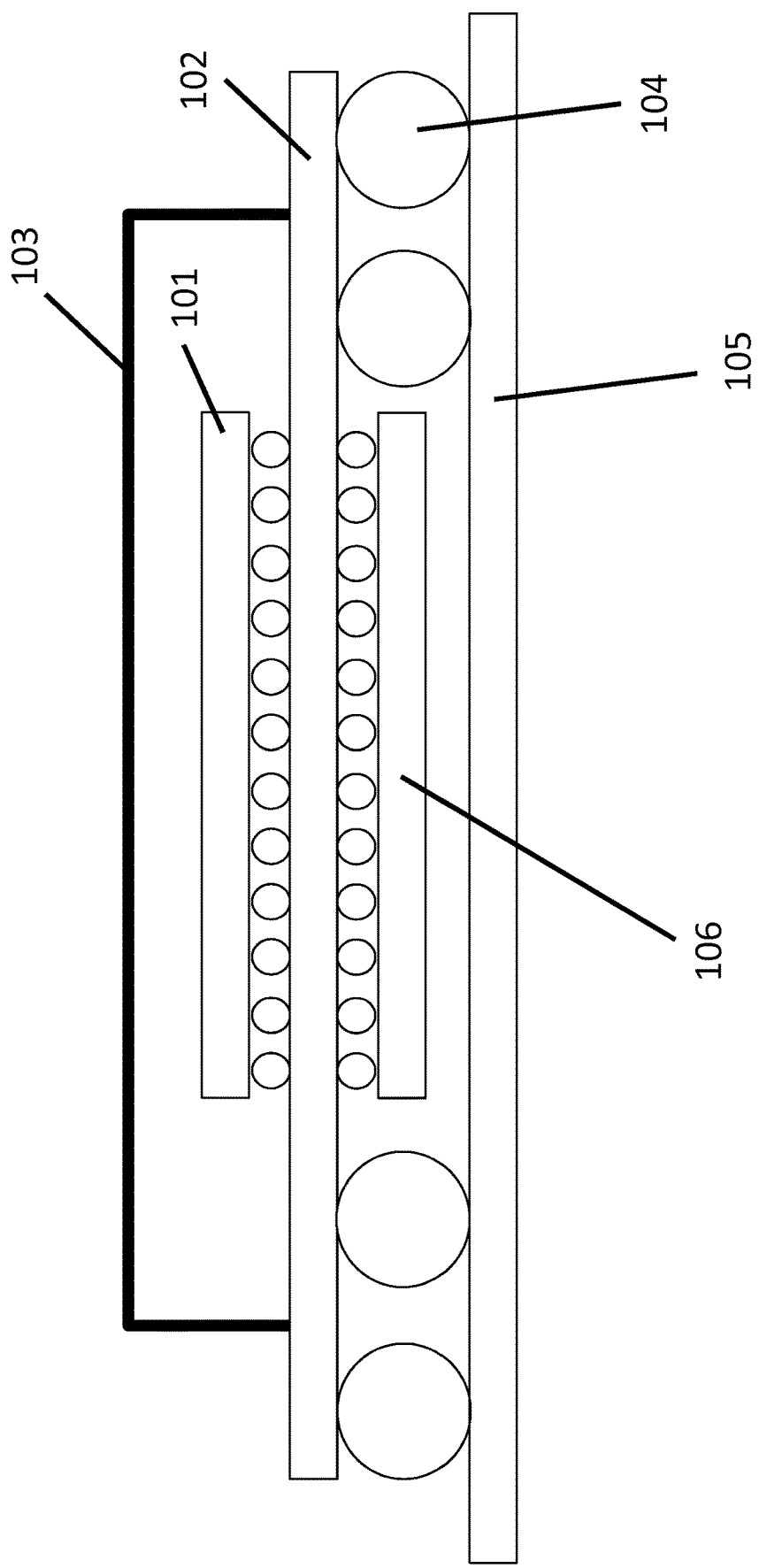
FIG. 1 shows a prior art semiconductor die package with hanging die.
Figure 2:
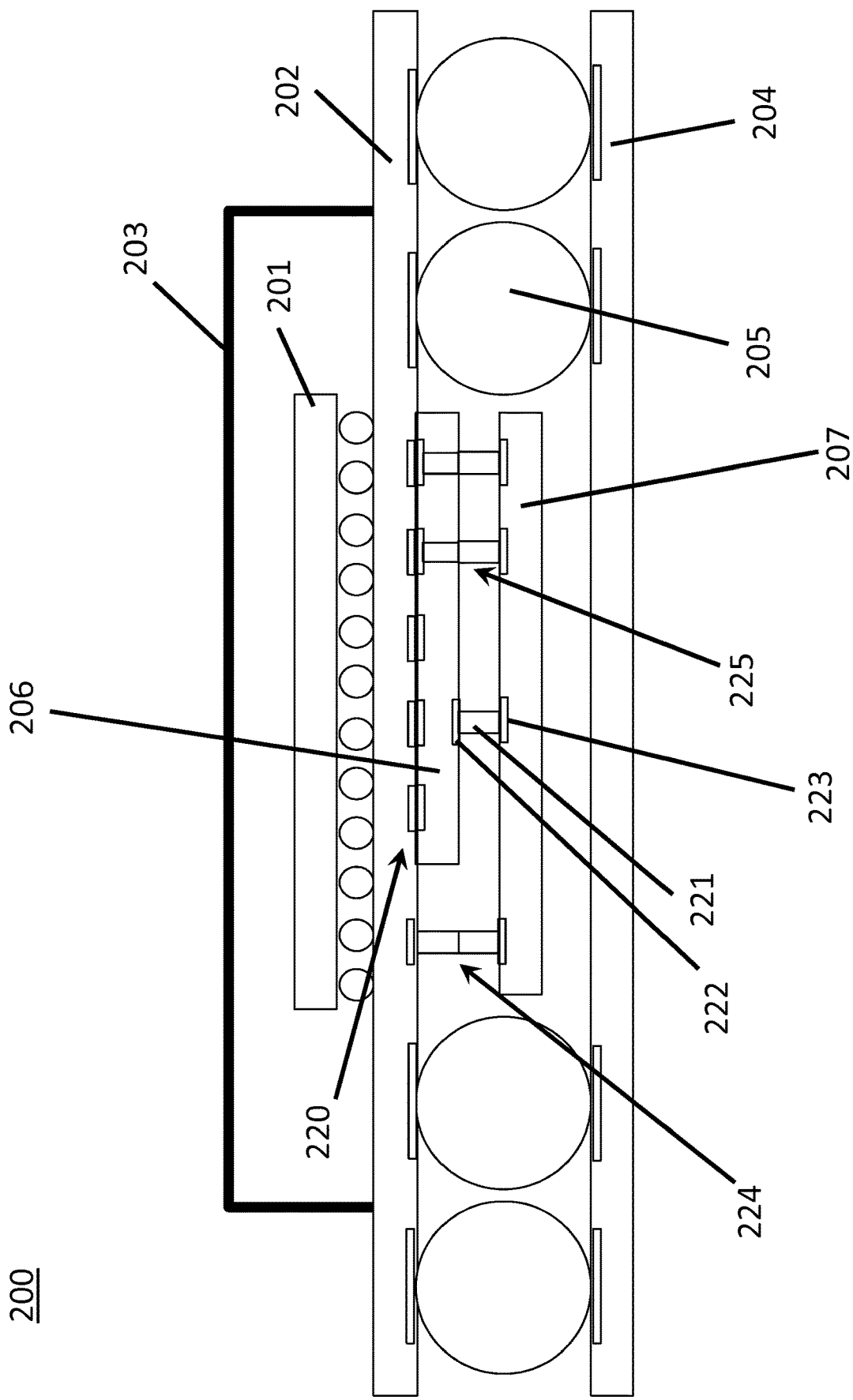
FIG. 2 shows a semiconductor die package with more than one hanging die.

FIG. 2 shows an improved semiconductor package 200 having more than one hanging die. Specifically, a first semiconductor die 206 and a second semiconductor die 207 are observed to be mounted to the underside of the package substrate 202. Different embodiments may align with the general design 200 observed in FIG. 2. For example, the package substrate 202 may be a planar board or redistribution layer.

As is known in the art a planar board is board composed of alternating dielectric and metallic layers that are patterned to effect wiring layers within the board. The dielectric layers may be composed, e.g., of ceramic, FR4, pre-preg composite fibers, etc. In the case where the substrate 202 is a planar board, typically, individual substrate boards are manufactured and a top-side die 201 is placed on each board individually. In other embodiments, substrate 202 is a redistribution layer.

Regardless as to what form the package substrate 202 takes, the top-side die 201 may be the only top-side or there may be multiple top side die. Alternatively or in combination surface mount devices may be mounted to the top-side of the substrate 202 whereas the top-side die, as observed in FIG. 2, is mounted with solder ball micro-balls or micro-bumps. The top-side die 201 may also instead be mounted to the substrate 202 with a land grid array rather than a micro-ball array or micro-bump array. In still yet other embodiments of the general design of FIG. 2, there is no top-side die 201 (only the hanging die 206, 207 exist).

As observed in the general design of FIG. 2, a first hanging die 206 is mounted to the underside of the package substrate with a land grid array 220 to minimize the effective height of the first hanging die beneath the bottom surface of the package substrate 202. Thus, I/O communication between the first hanging die 206 and the package substrate 202 is handled through the land grid array 220 directly. Direct I/O communication between the first hanging die 206 and the second hanging die 207 can take occur over a filled via or conductive plug 221 that couples an I/O pad 222 of the first hanging die 206 that faces an I/O pad 223 of the second hanging die 207.

Communication between the second hanging die 207 and the package substrate 202 may occur through filled via structures 224, 225 that extend from the package substrate 202 to the second hanging die 207. As observed in FIG. 2, such structures may extend off the periphery of the first semiconductor die 206 (as is the case with structure 224) or may extend through the first hanging semiconductor die 206 with a through-silicon via (as is the case with structure 225). Structures 224, 225 that couple the second hanging die 207 to the package substrate 202 may be used to transport signals between the second hanging die 207 and any of: 1) the top side die 201; 2) the planar board 204 (through a package ball 205); and, 3) the first hanging die 206 (e.g., where the communication runs through a land grid array pad 220 of the first hanging die 206 and the package substrate 202).

According to various embodiments, the hanging die 206, 207 are thinned and pad I/Os are used on the die 206, 207 (rather than micro-balls or micro-bumps) to keep the vertical profile of the dual hanging die structure less than the height of the package solder balls 205. In general, package I/O ball 205 diameter/height can be ~180 μm or higher and each stacked die 206, 207 can be thinned to a thickness of 20-50. Accounting for a spacing between the die 206, 207 of 20-50

µm, the total vertical profile of the stacked hanging die structure can be kept to a total height of 150 µm and below which is less than the package ball 205 height and even allows for proper collapse of the package I/O balls 205 during their reflow during attachment to board 204. Depending on solder ball 205 height/diameter a hanging die 206, 207 thickness, micro-balls and/or micro-bumps may be permissible I/O structures on either or both of the hanging die 206, 207.

Figure 3A:
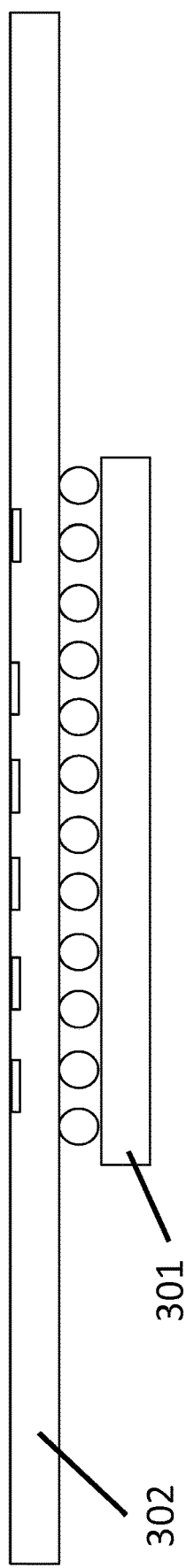
FIGS. 3a through 3n show a method of manufacturing the semiconductor die package of FIG. 2.
Figure 3C:
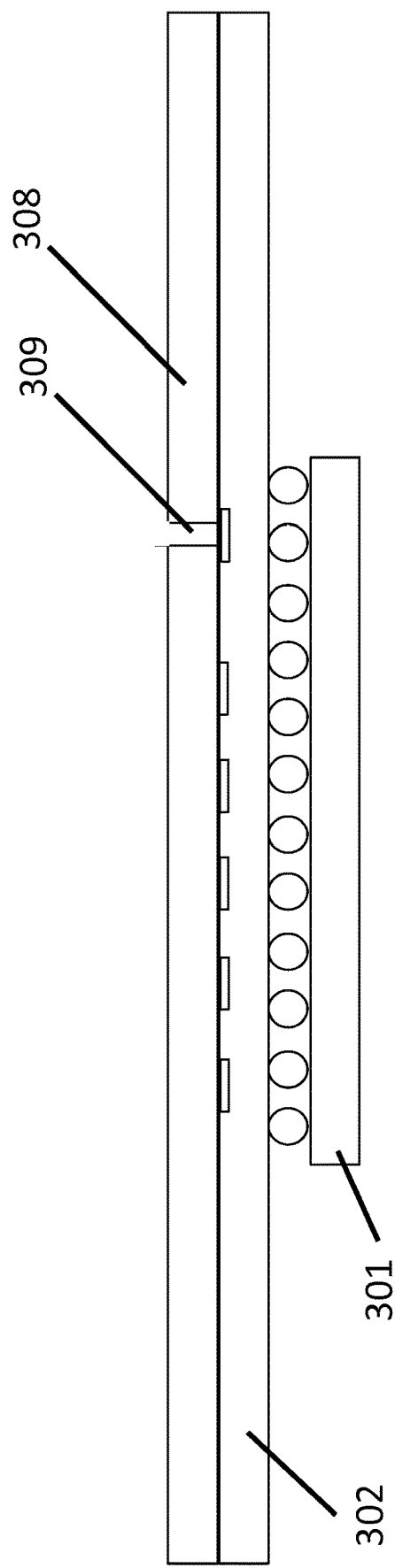
Figure 3D:
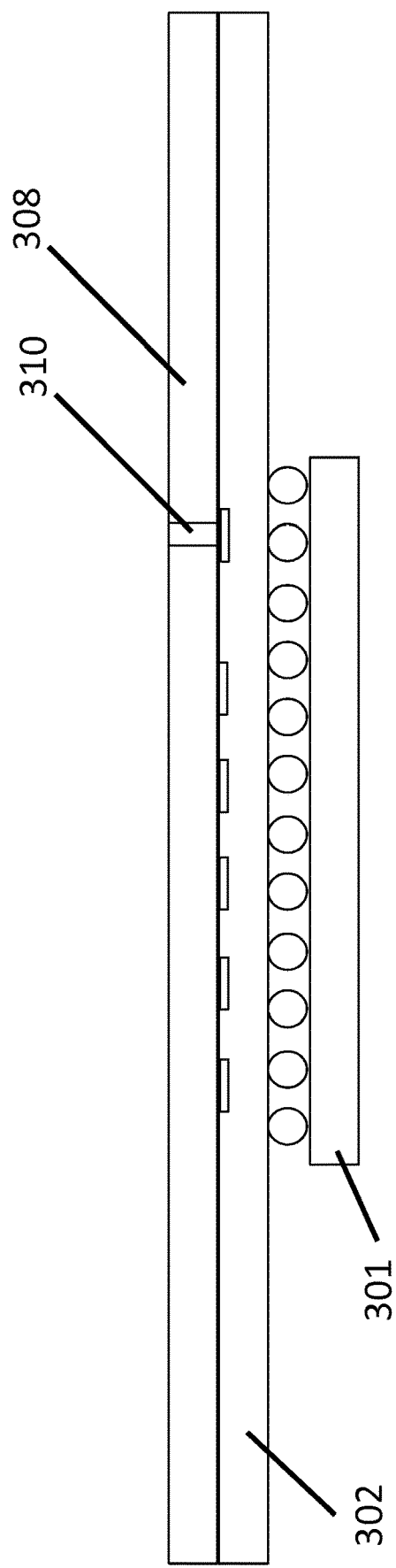
Figure 3E:
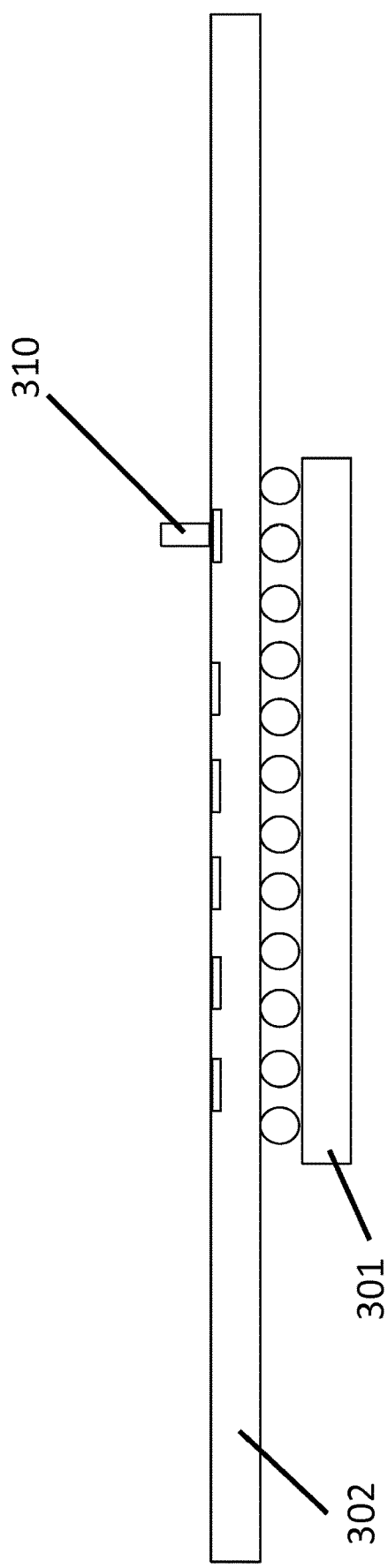
Figure 3F:
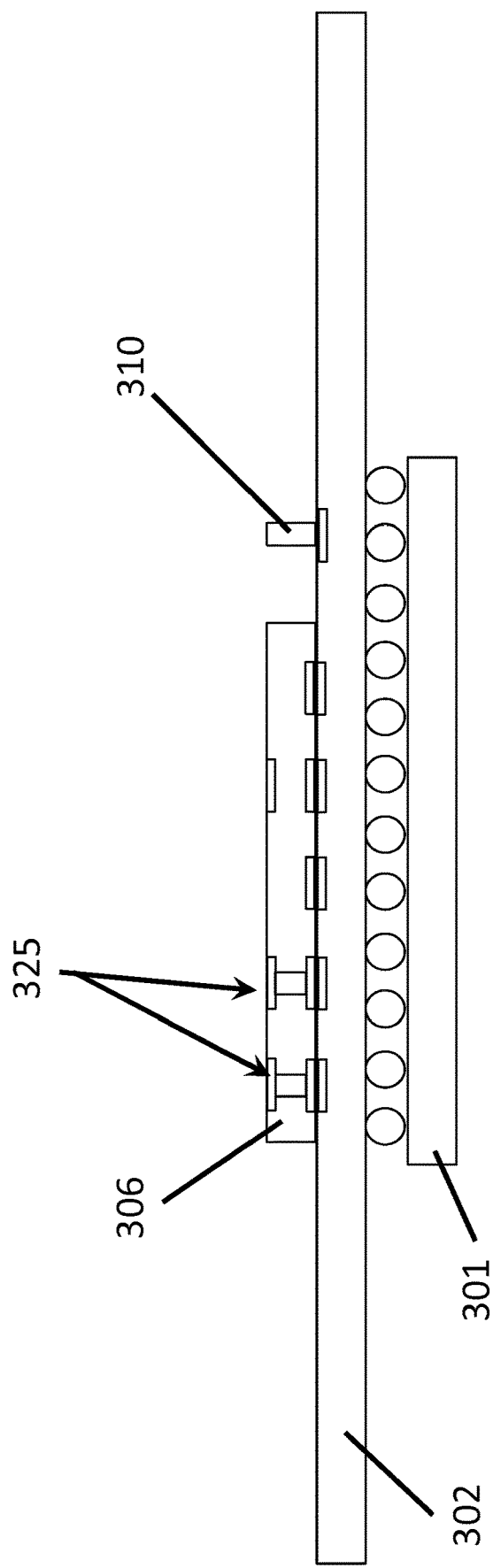
Figure 3G:
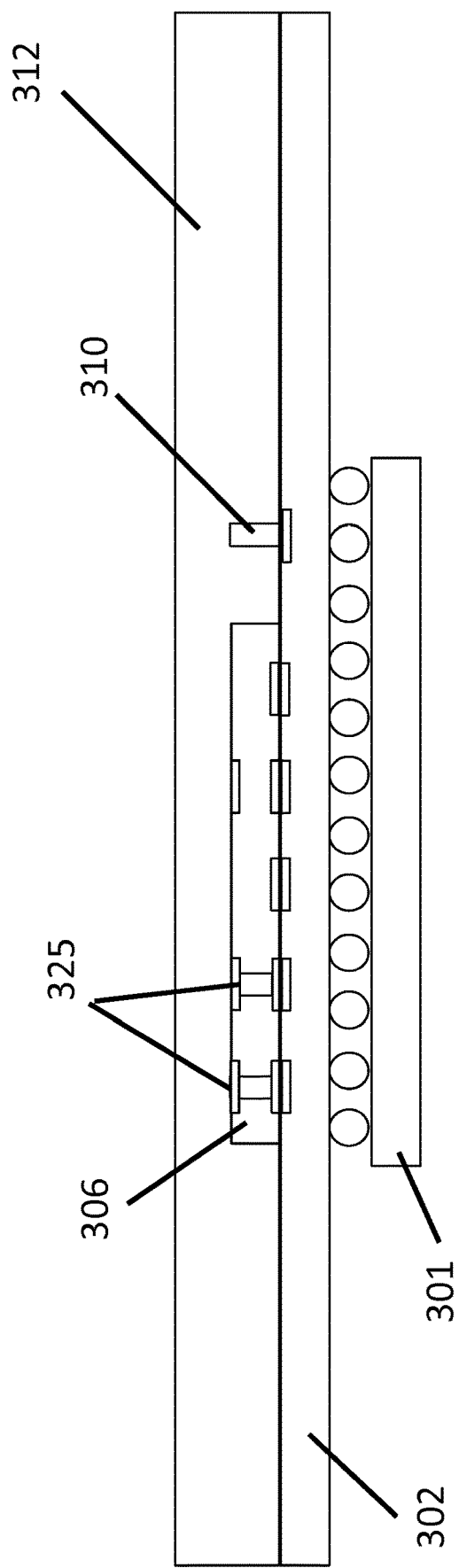
Figure 3H:
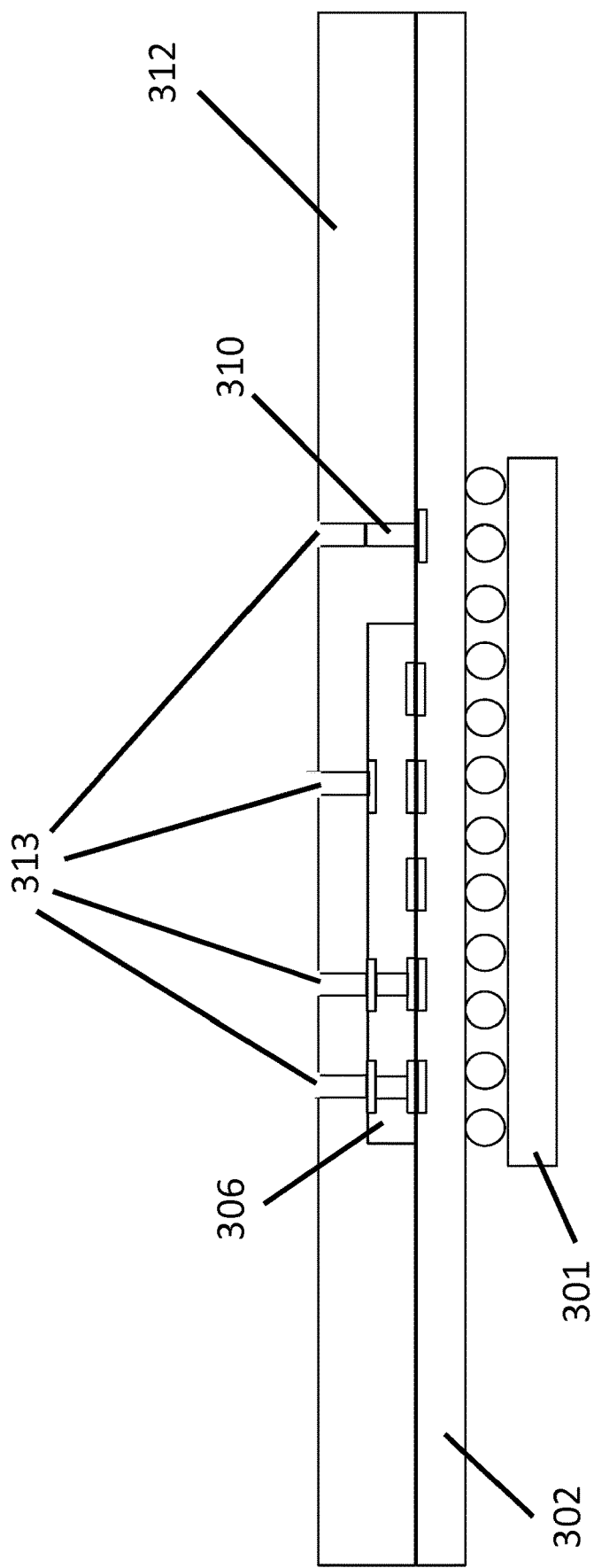
Figure 3I:
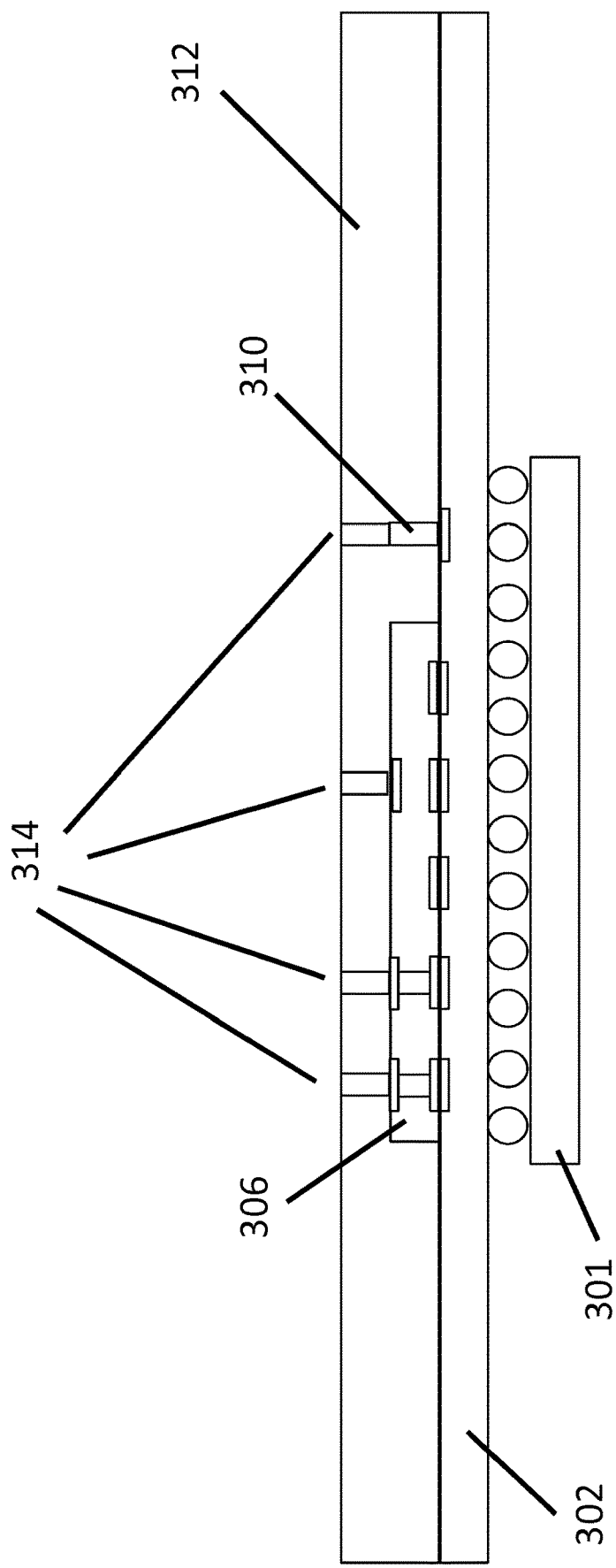
Figure 3J:
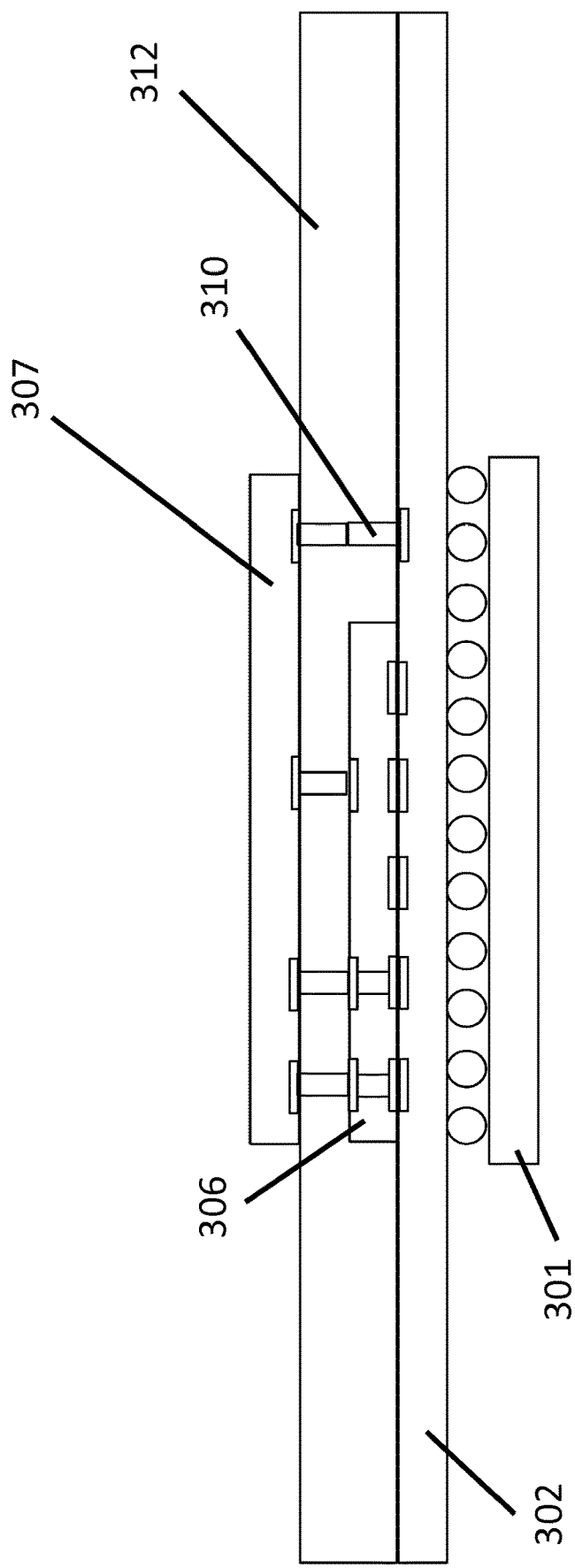
Figure 3K:
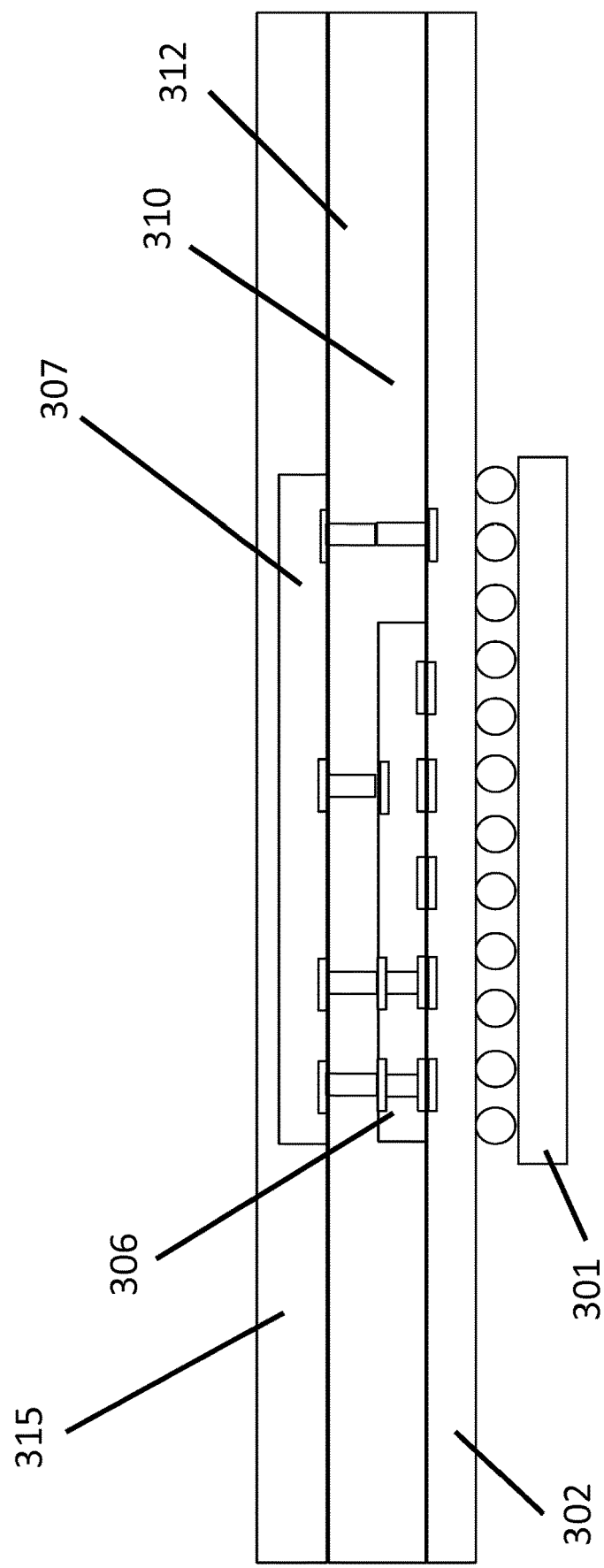
Figure 3I:
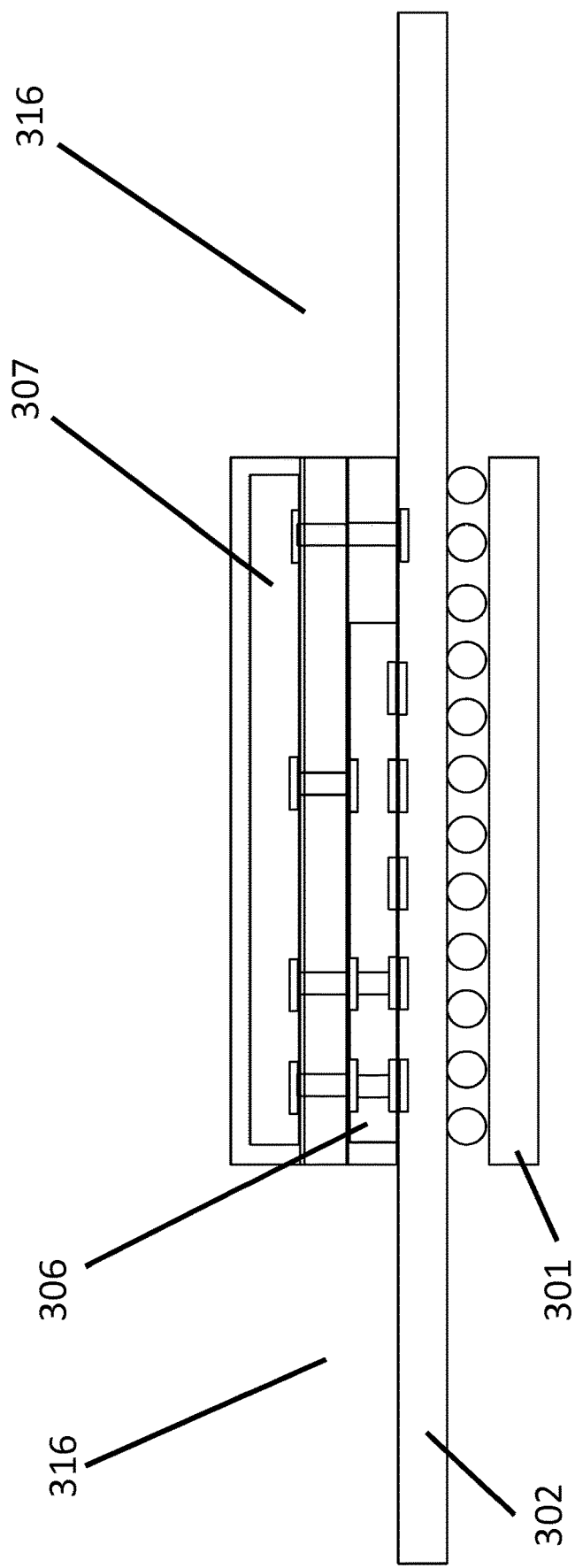
Figure 3M:
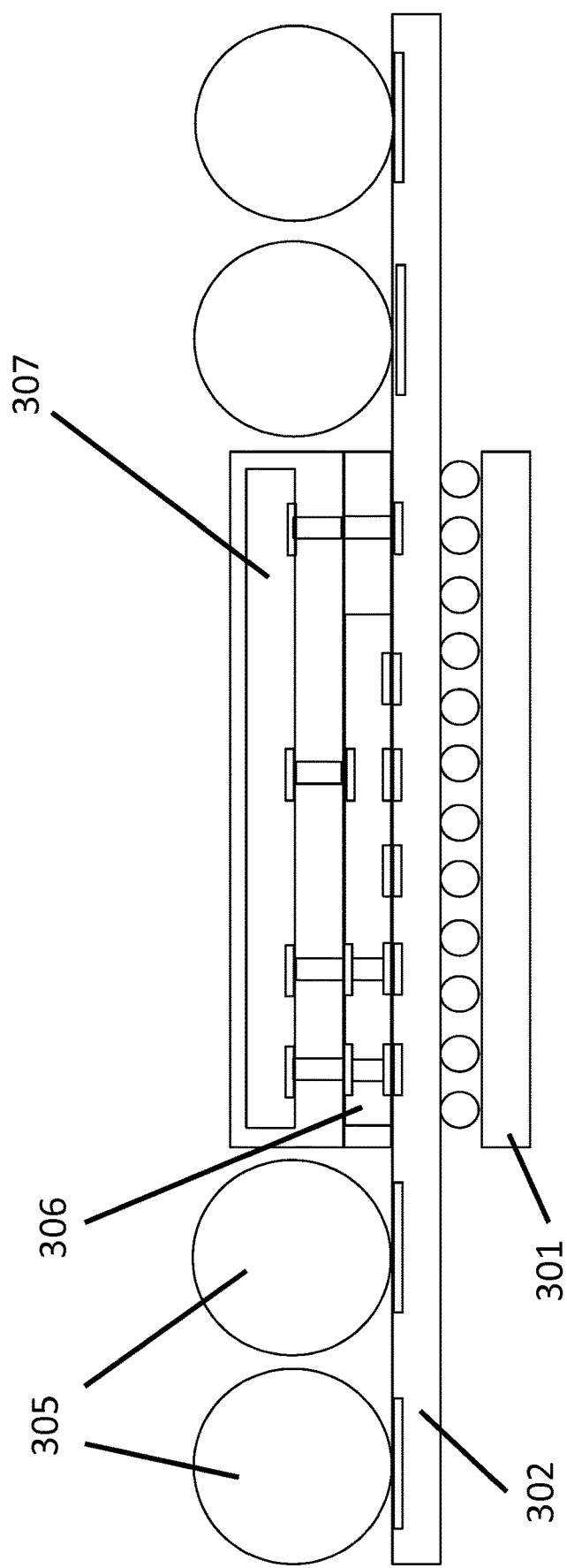
Figure 3N:
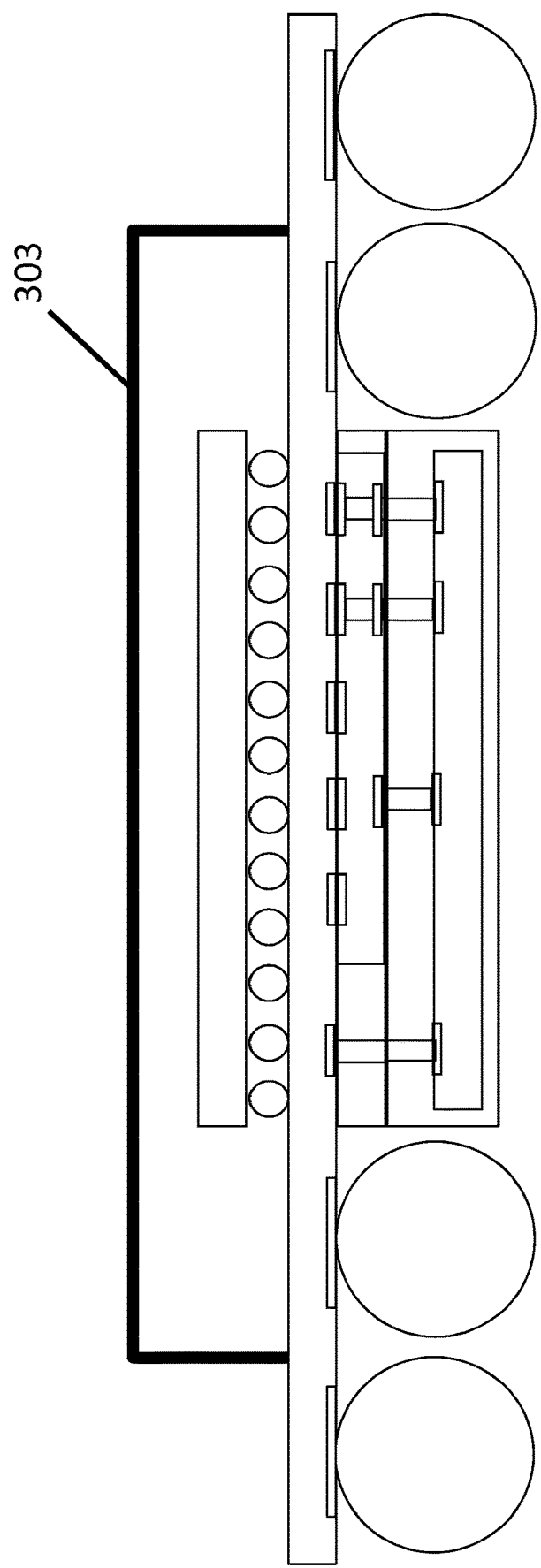

FIGS. 3a through 3n depict a method for manufacturing the package 200 of FIG. 2. As observed in FIG. 3, the top side die 301 is mounted to the package substrate 302 and the resulting structure is flipped to expose the underside of the package substrate 302. If the package substrate 302 is a planar board processing is executed on a board-by-board basis. If the package substrate 302 is a redistribution layer, substrate 302 corresponds to a larger wafer structure that multiple top-side die are mounted to and which will be diced during subsequent processing. In an embodiment, regardless of which form the substrate 302 takes, the process of attaching the top side die 301 to the package substrate 302 may include encapsulating the die 301 with a compound mold (not shown) and planarizing the mold so that the structure is mechanically stable when flipped as depicted in FIG. 3a. In an alternate or combined embodiment a special jig or fixture may be used to keep the filled structure stable without damaging the top-side die 301 or its electrical and/or mechanical attachment to the substrate 302.

As observed in FIG. 3b, a layer of photoresist material 308 is coated onto the package substrate 302. The photoresist 308 may be applied as a liquid and spun, or deposited according to various deposition techniques (e.g., laminating, printing, etc.) As observed in FIG. 3c, the photoresist 308 is patterned and etched to form a void 309 to expose a land on the surface of the package substrate 302. As observed in FIG. 3d, the void 309 is filled with electrically conductive material (e.g., a metal such as copper) to form a conductive plug or via 310. As observed in FIG. 3e, the photoresist 308 is removed from the substrate surface (e.g., by a chemical wash).

As observed in FIG. 3f, the first hanging die 306 is placed on and mounted to the land grid array on the surface of the package substrate 302. Here, the pads may be tinned with solder and the ambient temperature is raised to reflow the solder and form electrical and mechanical connections between the substrate 302 and the first hanging die 306. Note that in the embodiment of FIG. 3f, the die 306 already includes through-silicon vias 325.

As observed in FIG. 3g, a layer of dielectric 312 is formed over the substrate 302 and die 306. The dielectric layer 312 may be planarized (e.g., by chemical mechanical polish (CMP) an/or annealed to form a planar surface. As observed in FIG. 3h, the dielectric layer 312 is patterned and etched to form openings 313 that expose pads on the die 306, the substrate 302 and Cu-Pillar 310. As observed in FIG. 3i the openings 313 are filled with electrically conductive material to form electrically conductive plugs or vias 314. As observed in FIG. 3j, the second hanging 307 die is aligned with the plugs 314 and placed onto the dielectric layer 312. As observed in FIG. 3k a second dielectric layer 315 is formed over the second hanging die 307 to encapsulate the hanging die 306, 307 structure.

As observed in FIG. 3l, the dielectric layers around the hanging die 306, 307 are etched to form voids 316 around the hanging die 306, 307. As observed in FIG. 3m, package solder balls 305 are placed on the package substrate 302 in the region of the voids 316. As observed in FIG. 3n, the package is flipped and a lid 303 may be placed over the upper die 301. In various embodiments, if the package substrate 302 is a redistribution layer and wafer level processing is being performed, the wafer may be diced to form singulated package structures just after formation of the solder balls 305 on substrate 302 or just after the lid 303 is placed over the upper die 301. In other embodiments, conceivably, the lid 303 may be present early on in the process, e.g., as of FIG. 3a.

Figure 4A:
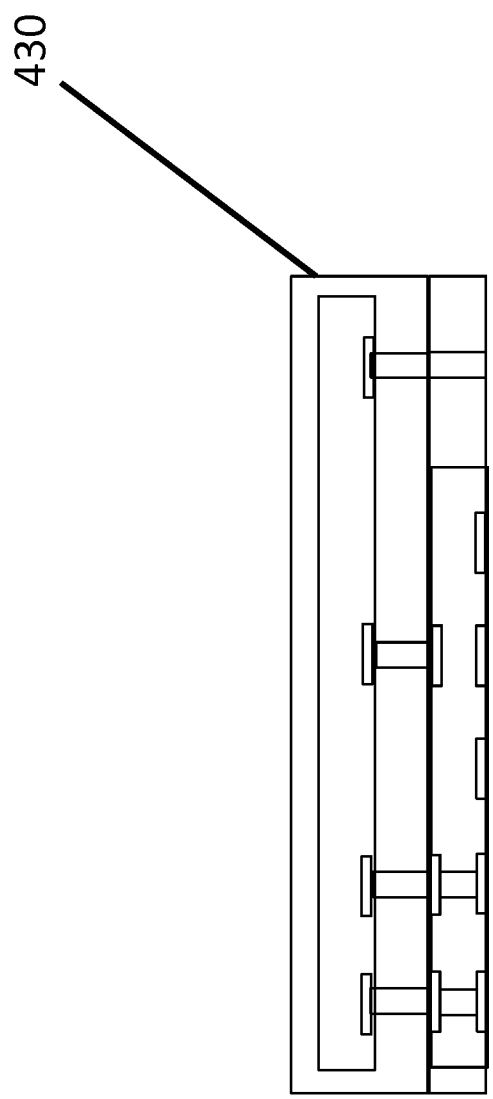
Figure 4B:
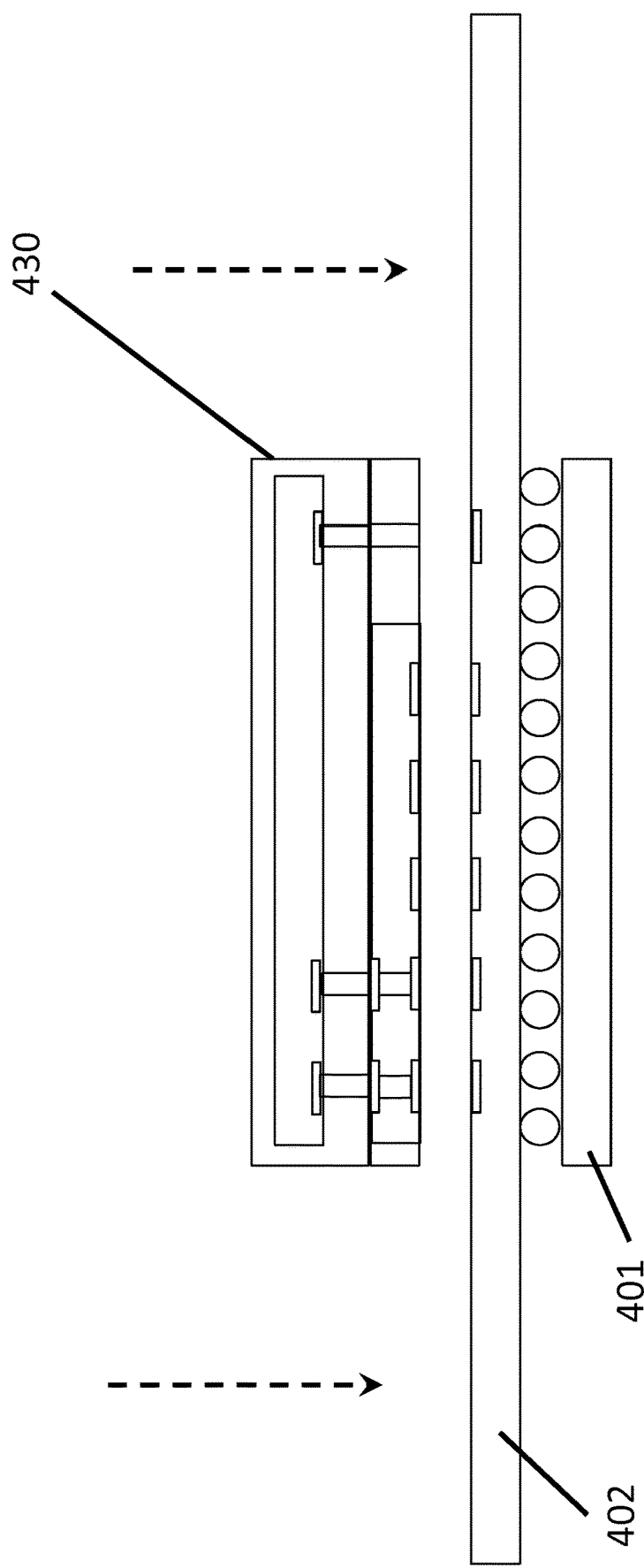

FIGS. 3a through 3n demonstrated a process by which the hanging die 306, 307 were individually placed on the package substrate 302. By contrast, FIGS. 4a through 4c pertain to another embodiment where the entire stacked hanging die structure is created separately and then attached to the package substrate as a whole. FIG. 4a shows a singulated hanging die structure 430 that may be formed very similarly to the processes outlined above with respect to FIGS. 3b through 3l except that the structure 430 is formed on a removable carrier substrate rather than the actual package substrate 402. FIG. 4a shows the structure 430 after the removable carrier substrate has been removed. As observed in FIGS. 4b and 4c, the finished hanging die structure 430 is attached to the land grid array of the package substrate 402. From the point of FIG. 4c, the process may then commence as described above with respect to FIGS. 3l to 3n.

Figure 5:
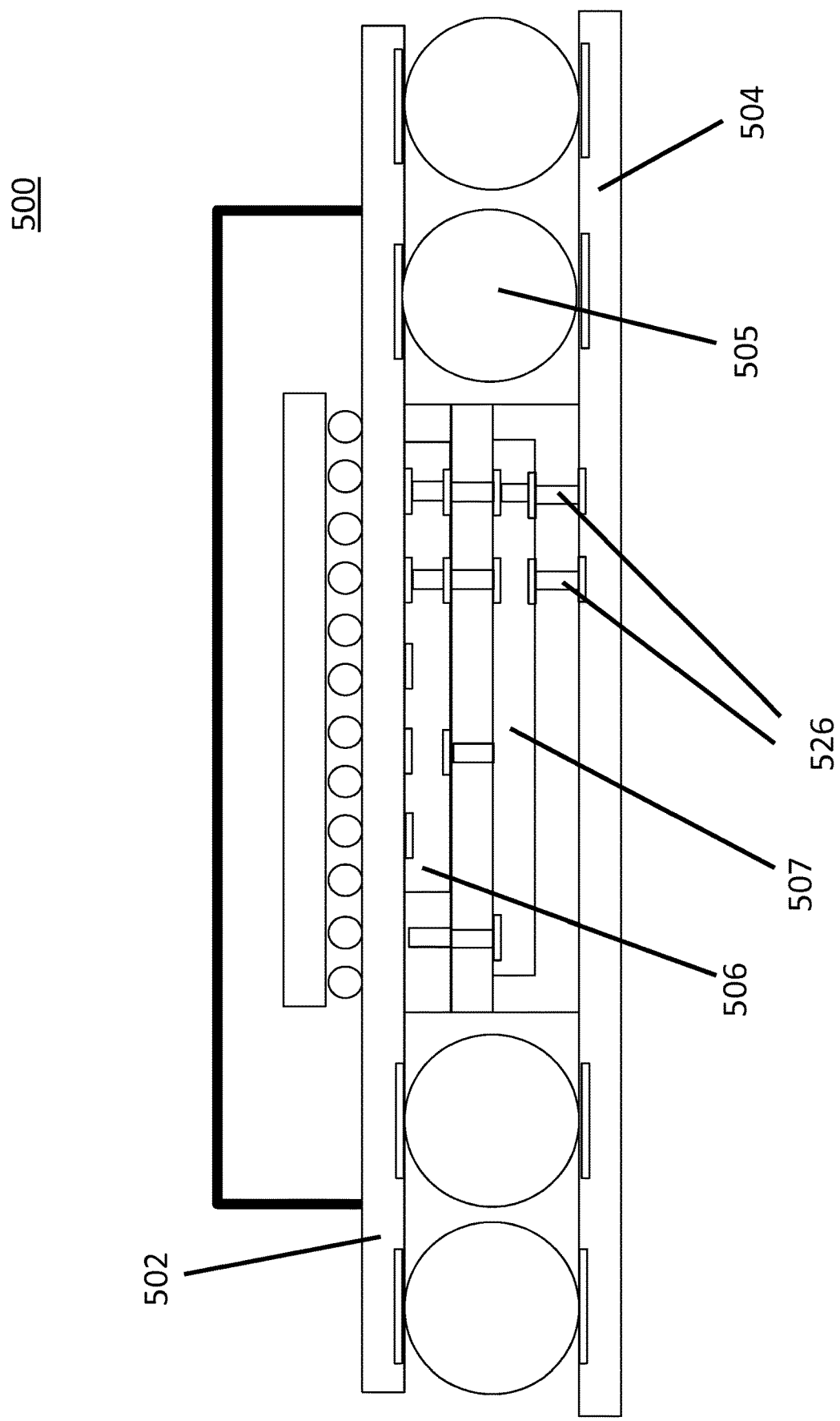
FIG. 5 shows a second semiconductor die package with more than one hanging die.

FIG. 5 shows multiple hanging die package 500 that improves upon the general design of FIG. 2. As observed in FIG. 5, the package 500 includes direct connections 526 between the second hanging die 507 and the planar board 504. Whereas the design 200 of FIG. 2 requires electrical coupling between the second hanging die 207 and the planar board 204 to pass through the package substrate 202, by contrast, the package design 500 of FIG. 5 permits such coupling to pass through the second hanging die 507 and planar board 504 directly.

Figure 6A:
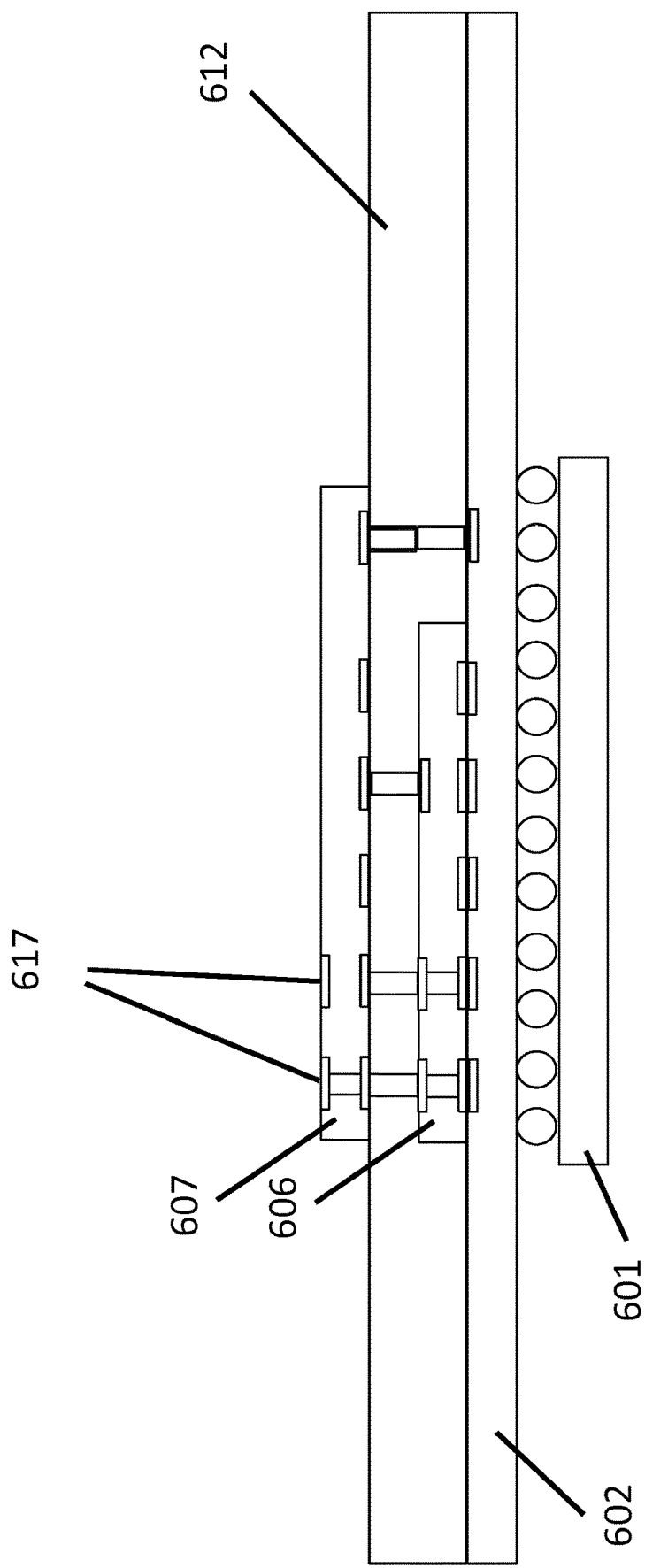
FIGS. 6a through 6d show a method of manufacturing the semiconductor die package of FIG. 5.
Figure 6B:
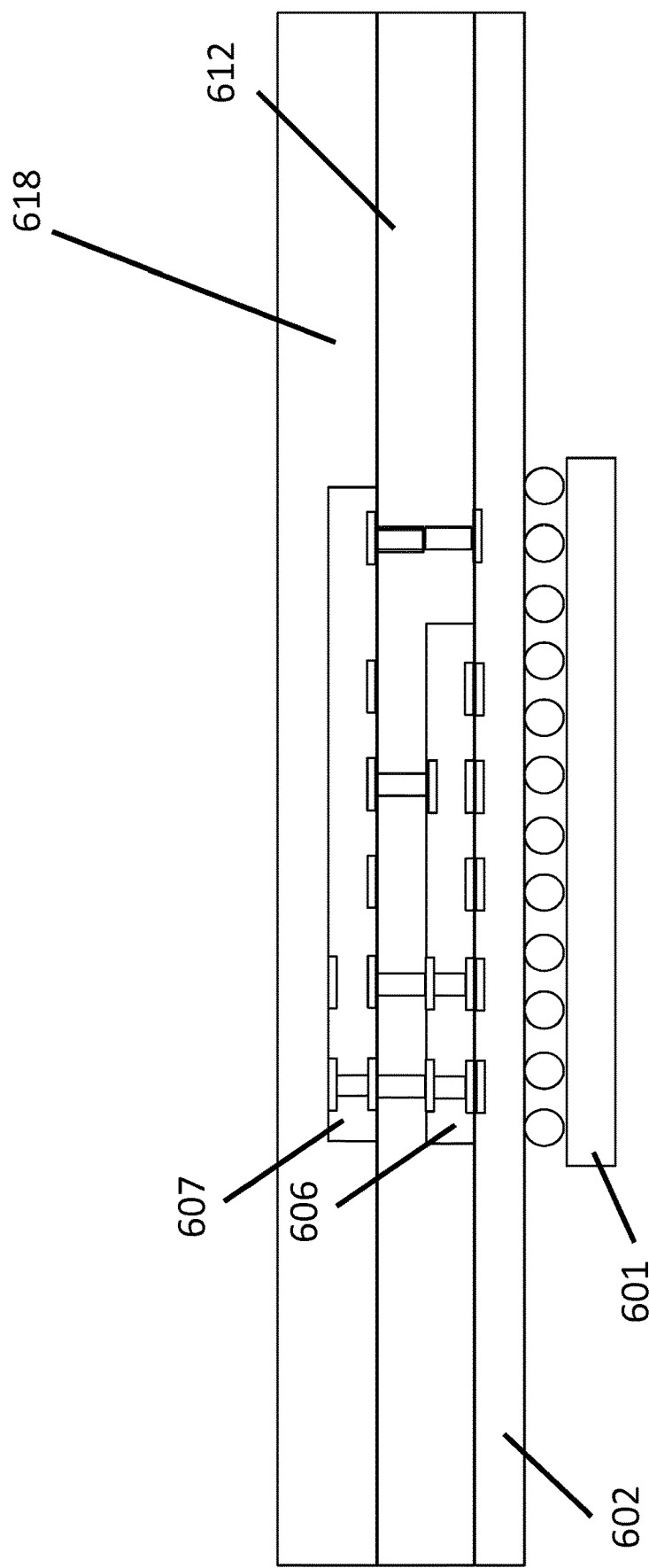
Figure 6C:
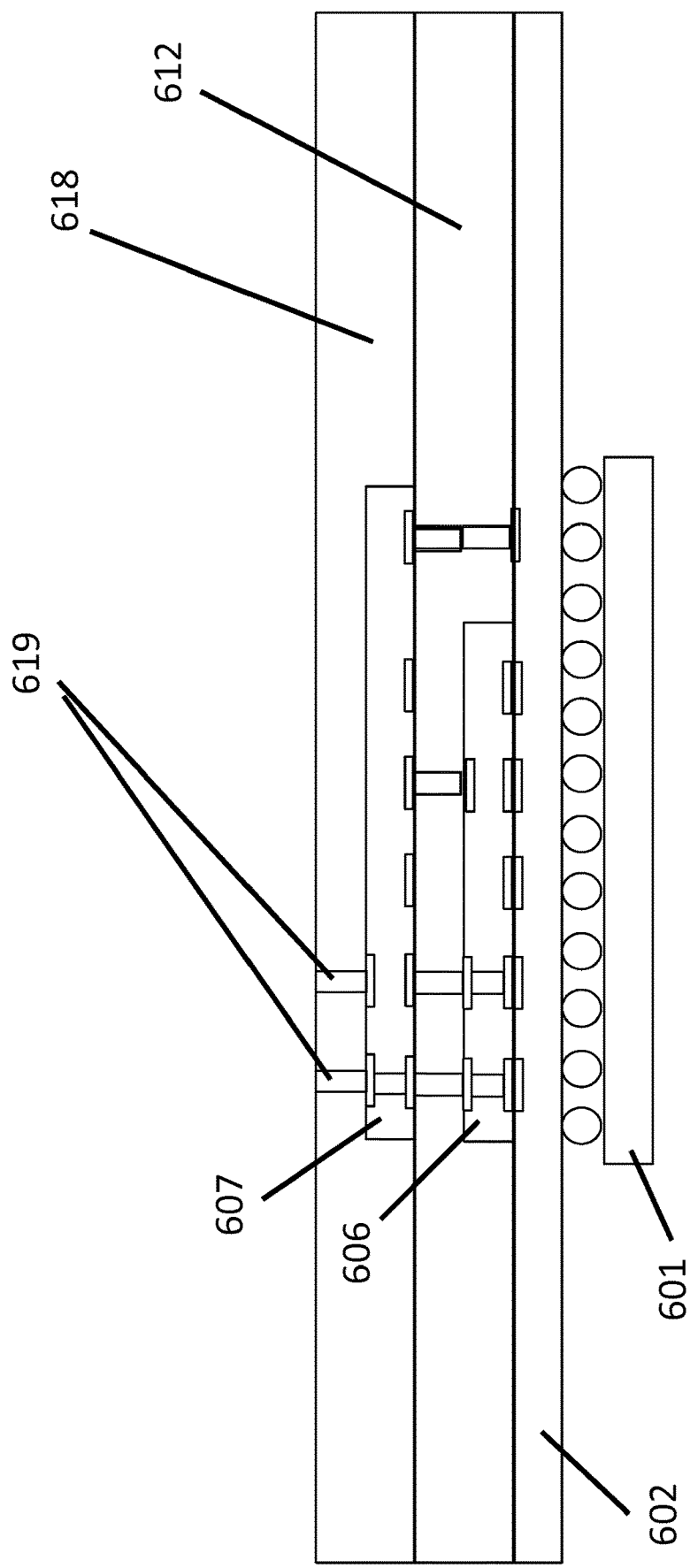
Figure 6D:
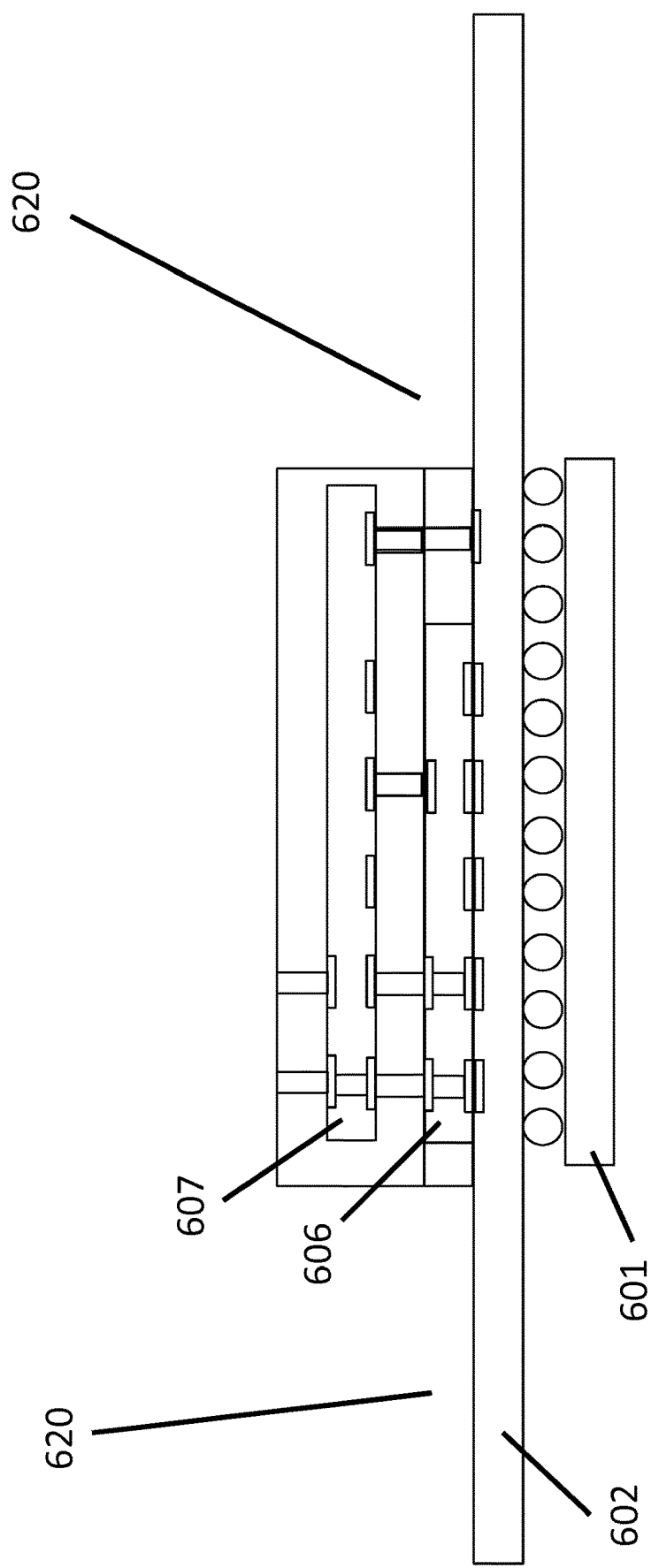

FIGS. 6a through 6h show a method for manufacturing the package of FIG. 5. FIG. 6a assumes the processes of FIGS. 3a through 3j have already been performed. As observed in FIG. 6a, the second hanging die is placed onto the second dielectric layer 612. Notably, the second hanging die not only includes pads that face the first hanging die 606 but also includes pads 617 on the opposite die side that will face the planar board. As observed in FIG. 6b, a third layer of dielectric 618 is formed over the structure of FIG. 6a. As observed in FIG. 6c, the third layer of dielectric is pattern and etched to expose the pads of the second hanging die 607. The voids formed by the etching are subsequently filled with electronically conductive material to form electrically conductive plugs 619. As observed in FIG. 6d, the structure of FIG. 6c is patterned and etched to form voids 620 around the stacked hanging die structure. From FIG. 6d, the process flow can commence similarly to that of FIGS. 3l to 3n to form a complete package that is coupled to the planar board.

FIG. 7 shows another improved package design that includes a package side heat spreader structure 727 and a planar board side heat spreader structure 728. The package side heat spreader structure 727 can be formed during the hanging die manufacture process. For example, starting with the structure of FIG. 6c, a fourth layer of dielectric may be formed on the surface which is subsequently patterned and etched to create the void for the package side heat spreader 727. The void is then subsequently filled with electrically conductive material to actual form the package side heat spreader 727. Alternatively, structure 727 may be formed as part of the planar board 704. Although FIG. 7 does not show direct electrical connections between the second hanging die 707 and the planar board for illustrative convenience (such as direct electrical connections 526 in FIG. 5), they may also exist in the package design of FIG. 7.

Figure 8:
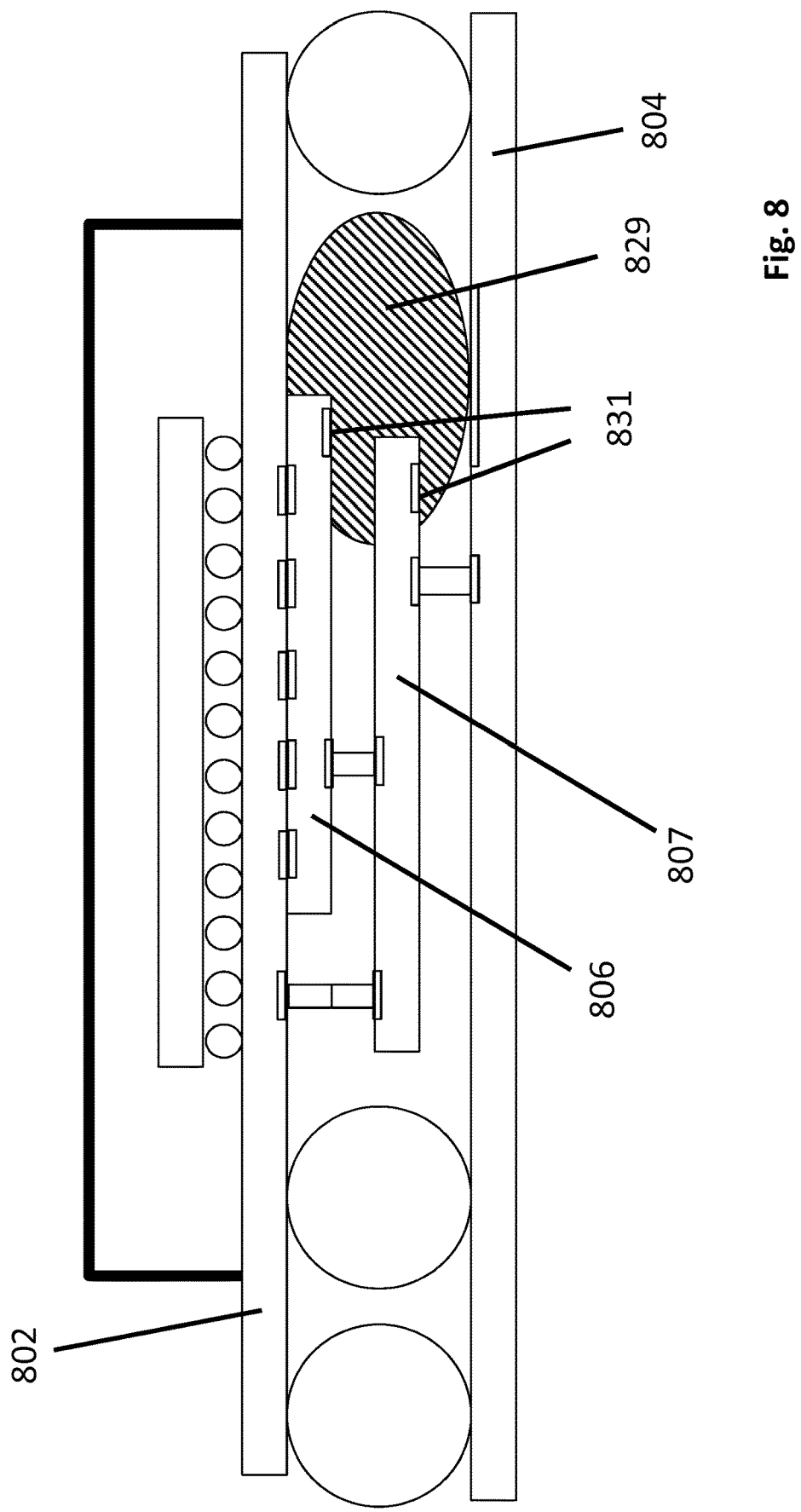
FIG. 8 shows a fourth semiconductor die package with more than one hanging die.

FIG. 8 shows another design, which includes a special solder ball 829 that makes electrical contact to pads 831 of both hanging die 806, 807. Although a heat spreader structure such as heat spreader structures 727, 728 of FIG. 7 are not shown in FIG. 8 for illustrative ease, they may likewise exist in the embodiment of FIG. 8.

Figure 9B:
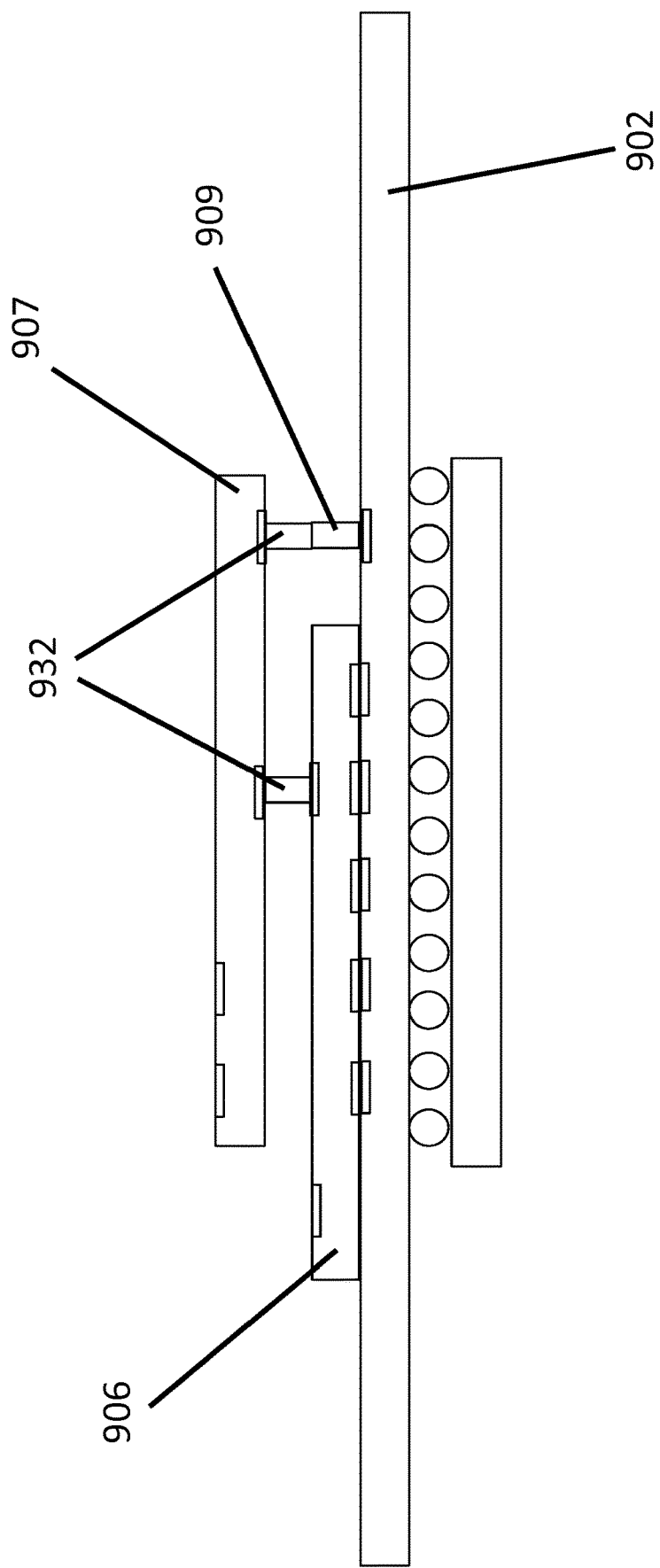
Figure 9D:
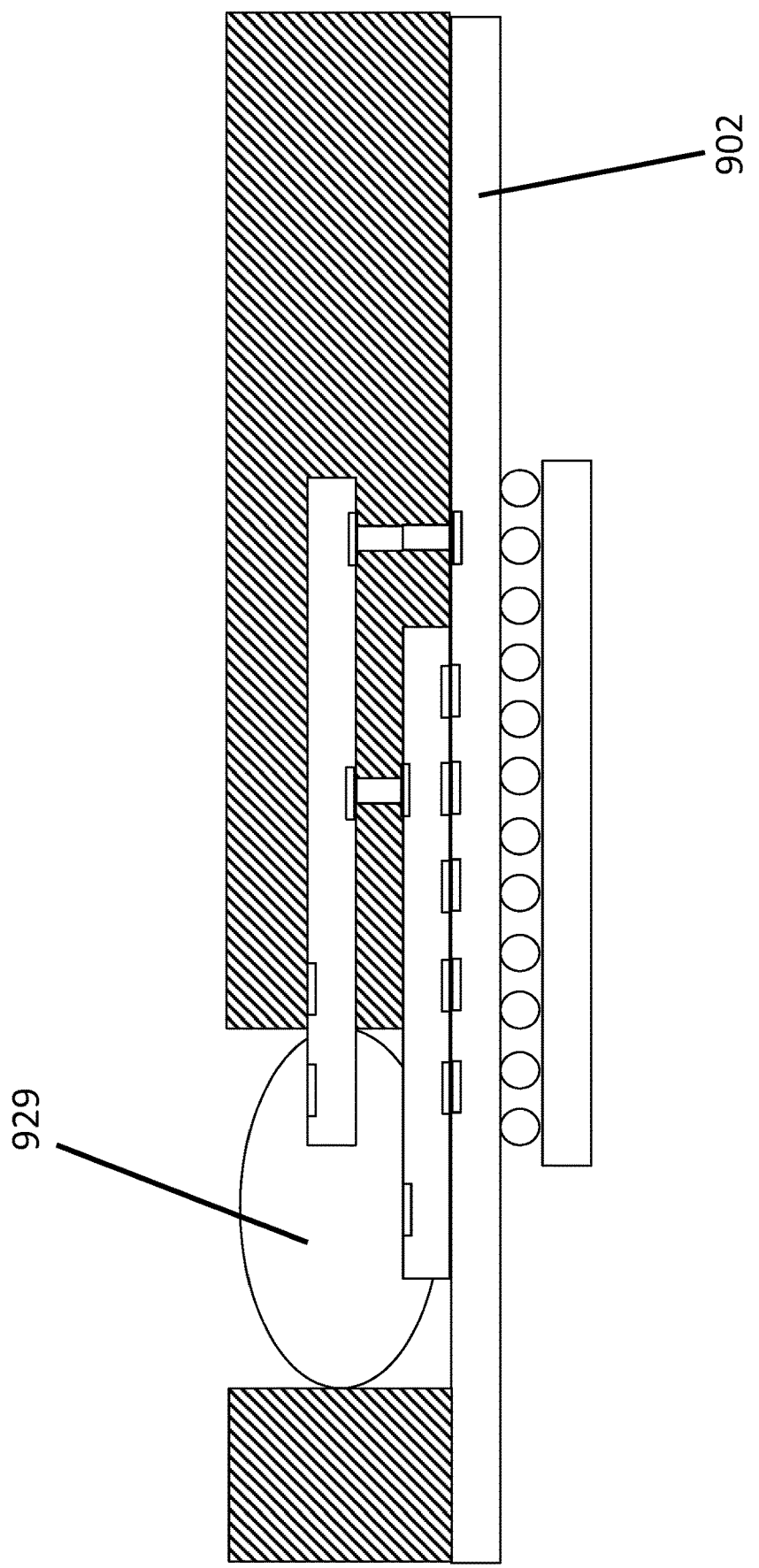

FIGS. 9a through 9d show a method of manufacturing the package of FIG. 8. FIG. 9a assumes the processing of FIGS. 3a through 3e have already taken place. FIG. 9b shows placement of the second hanging die 907 on the first hanging die 906. Note that the second hanging die 907 includes, as part of its manufacture, integrated conductive plugs 932 that mate to the pads on the exposed surface of the first hanging die 906 and the plug 909 off the periphery of the first die 906 of FIG. 9a. As observed in FIG. 9c, the structure of FIG. 9b has a conforming dielectric layer 934 formed around the structure of FIG. 9b which is subsequently patterned and etched to create an opening for the multiple contact solder ball. As observed in FIG. 9d, the multiple contact solder ball 929 is formed in the opening. The process may then continue to form additional solder balls. Ball 929 may be useful for making power or ground connections between the planar board, both hanging die and the upper die.

FIG. 10 shows another embodiment in which the planar board solder balls 1005 are formed on raised lands 1035 formed during the planar board manufacturing process. The raised lands 1035 may be formed by manufacturing a lower layer of electrically conductive plugs on the planar board surface and then forming a large conductive pad on the plugs. The raised lands 1035 can be used to provide for more clearance for the multiple hanging die structure if the solder ball diameter/height by itself is not sufficient to provide appropriate clearance. The lands 1035 may be present in any of the embodiments described above.

Although the above described embodiments have been limited to only two hanging die, it is conceivable that, e.g., one or more of appropriate hanging die thinning, large package I/O ball height/diameter and raised lands from off the planar board may permit more than two hanging die structures by adding additional process sequences of and to methodologies described above.

Figure 11:
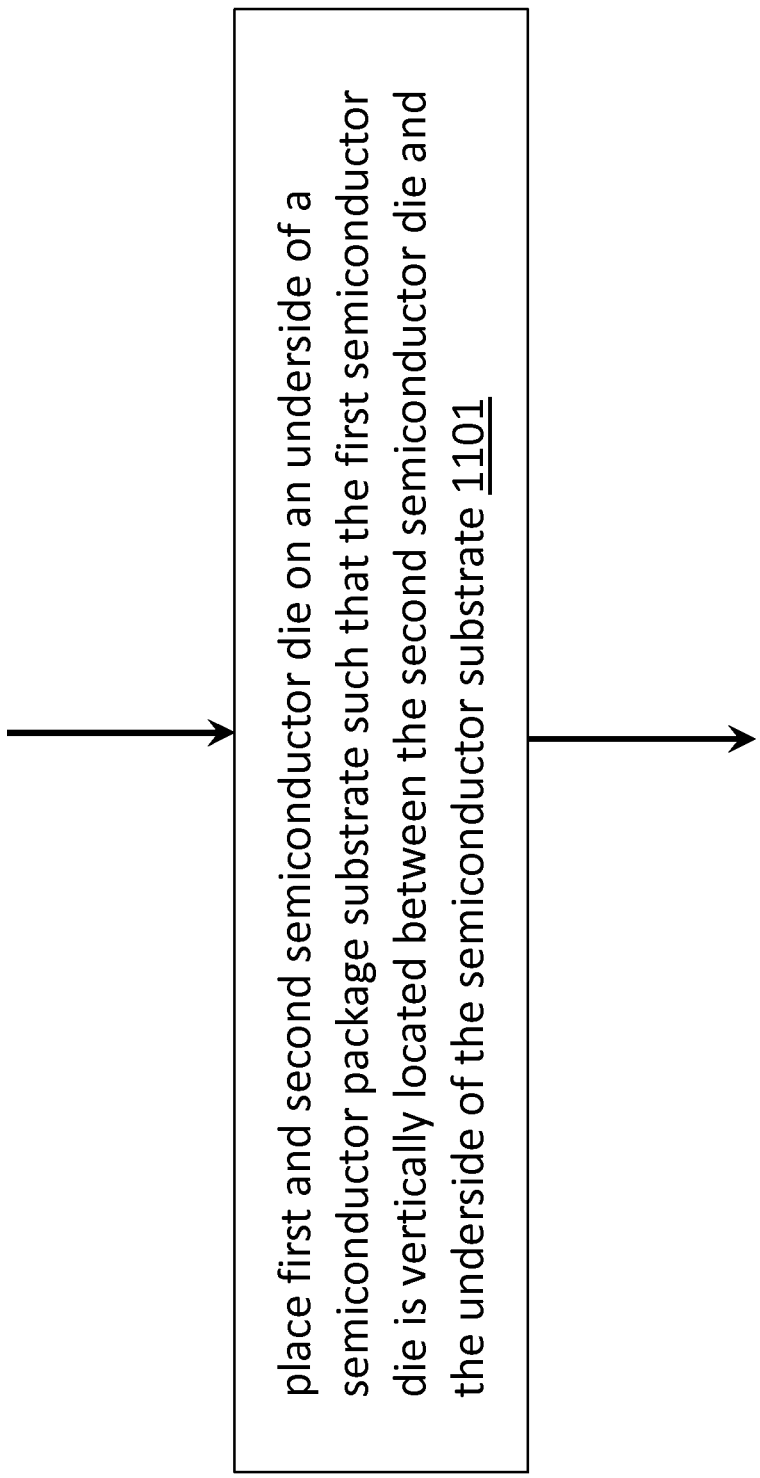
FIG. 11 shows a method of the above methodologies.

FIG. 11 shows a method described above. The method includes placing first and second semiconductor die on an underside of a semiconductor package substrate such that the first semiconductor die is vertically located between the second semiconductor die and the underside of said semiconductor substrate 1101.

Figure 12:
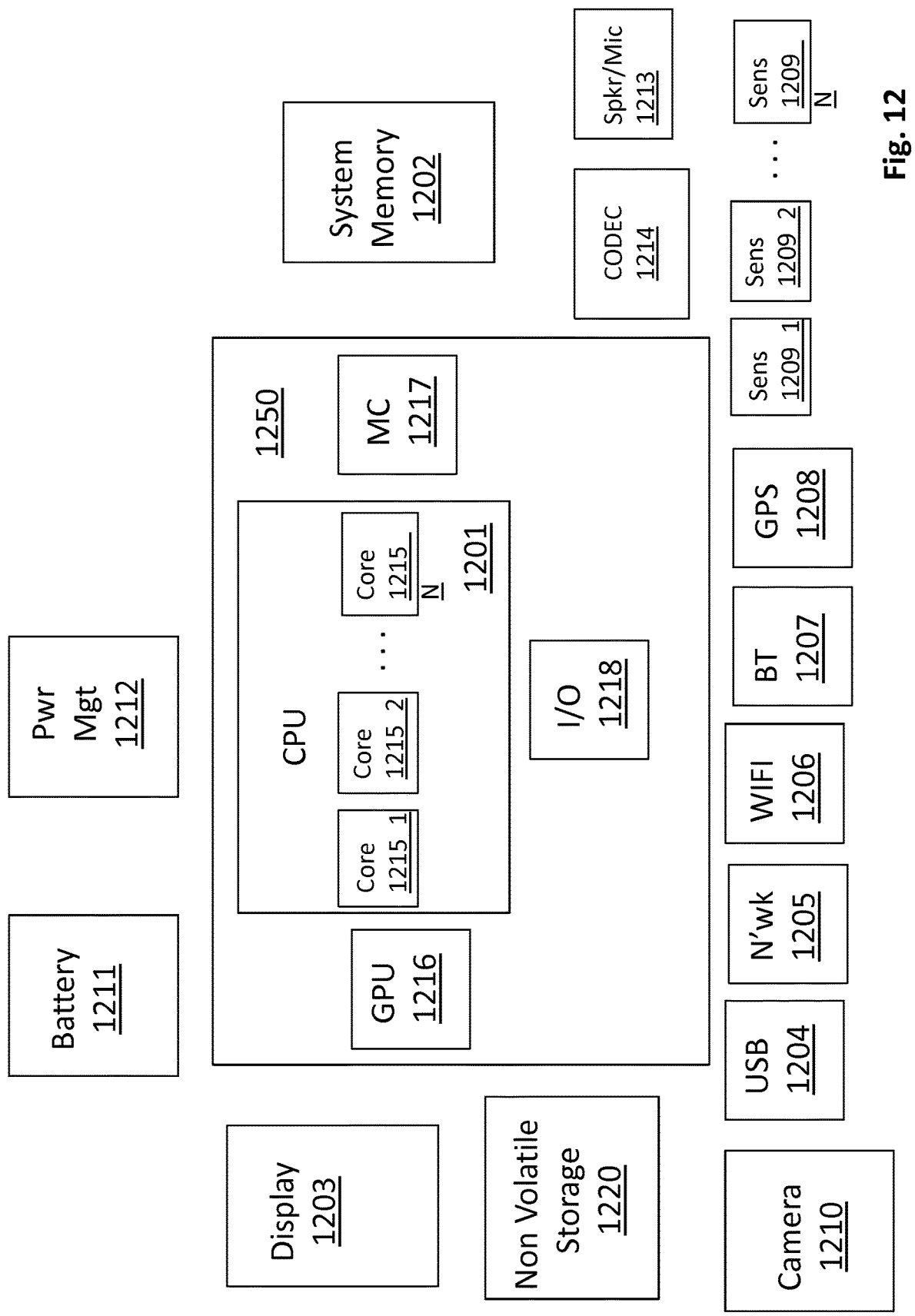
FIG. 12 shows a computing system.

FIG. 12 shows a depiction of an exemplary computing system 1200 such as a personal computing system (e.g., desktop or laptop) or a mobile or handheld computing system such as a tablet device or smartphone, or, a larger computing system such as a server computing system. The computing system may contain any of the package structures described above. In particular various components described below may be correspond to the different die of the integrated package described above. For instance the upper die 201 described above may be a large system on chip that includes the processing cores, memory controller and I/O hub described below. The hanging die may be a semiconductor die associated with any other component described below.

As observed in FIG. 12, the basic computing system may include a central processing unit 1201 (which may include, e.g., a plurality of general purpose processing cores and a main memory controller disposed on an applications processor or multi-core processor), system memory 1202, a display 1203 (e.g., touchscreen, flat-panel), a local wired point-to-point link (e.g., USB) interface 1204, various network I/O functions 1205 (such as an Ethernet interface and/or cellular modem subsystem), a wireless local area network (e.g., WiFi) interface 1206, a wireless point-to-point link (e.g., Bluetooth) interface 1207 and a Global Positioning System interface 1208, various sensors 1209_1 through 1209_N (e.g., one or more of a gyroscope, an accelerometer, a magnetometer, a temperature sensor, a pressure sensor, a humidity sensor, etc.), a camera 1210, a battery 1211, a power management control unit 1212, a speaker and microphone 1213 and an audio coder/decoder 1214.

An applications processor or multi-core processor 1250 may include one or more general purpose processing cores 1215 within its CPU 1201, one or more graphical processing units 1216, a memory management function 1217 (e.g., a memory controller) and an I/O control function 1218. The general purpose processing cores 1215 typically execute the operating system and application software of the computing system. The graphics processing units 1216 typically execute graphics intensive functions to, e.g., generate graphics information that is presented on the display 1203. The memory control function 1217 interfaces with the system memory 1202. The system memory 1202 may be a multi-level system memory.

Each of the touchscreen display 1203, the communication interfaces 1204-1207, the GPS interface 1208, the sensors 1209, the camera 1210, and the speaker/microphone codec 1213, 1214 all can be viewed as various forms of I/O (input and/or output) relative to the overall computing system including, where appropriate, an integrated peripheral device as well (e.g., the camera 1210). Depending on implementation, various ones of these I/O components may be integrated on the applications processor/multi-core processor 1250 or may be located off the die or outside the package of the applications processor/multi-core processor 1250.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

An apparatus has been described above that includes a semiconductor die package comprising a semiconductor die package substrate having: a top side and a bottom side, I/O balls on the bottom side of the semiconductor die package substrate (where the I/O balls are to mount to a planar board), a first semiconductor die mounted on the bottom side of the semiconductor die package substrate, where, the first semiconductor die is vertically located between the bottom side of the semiconductor die package substrate and a second semiconductor die that is a part of the semiconductor die package. In an embodiment, the apparatus further includes a third semiconductor die that is mounted to the top side of the semiconductor package substrate. In yet another embodiment, the first semiconductor die is mounted on the bottom side of the semiconductor package substrate with a land grid array.

In yet another embodiment, a direct electrical connection between the semiconductor package substrate and the second semiconductor die. In yet another embodiment, the direct electrical connection passes through the first semiconductor die. In yet another embodiment, the apparatus includes an I/O ball of the I/O balls that is in electrical and physical contact with the first and second semiconductor die. In yet another embodiment, the apparatus includes an electrical connection between said first and second semiconductor die. In a furtherance of this embodiment, the electrical connection is formed by a conductive plug located between the first and second semiconductor die. In yet another furtherance, the electrical connection runs though the semiconductor package. substrate.

In an embodiment of the apparatus, the apparatus further includes a heat spreader structure to make contact with the planar board where the second semiconductor die is between the heat spreader structure and the first semiconductor die. In an embodiment, the apparatus further includes an electrical contact stemming from the second semiconductor die to make contact with the planar board, where the second semiconductor die is between the electrical contact and the first semiconductor die.

A method is described that includes placing first and second semiconductor die on an underside of a semiconductor package substrate such that the first semiconductor die is vertically located between the second semiconductor die and the underside of the semiconductor substrate. In an embodiment, the first and second semiconductor die are part of a pre-fabricated structure that is mounted on the underside of the semiconductor package substrate. In an embodiment, the first semiconductor die is mounted on the underside of the semiconductor package substrate and then the second semiconductor die is placed over the first semiconductor die. In an embodiment, the method further includes forming an I/O ball of the semiconductor package that makes physical contact with the first and second semiconductor die.

In yet another embodiment, the method further includes forming a heat spreader over the second semiconductor die. In an embodiment, the method further includes forming an electrical contact between the first and second semiconductor die that physical resides between the first and second semiconductor die. In an embodiment, the method further includes forming an electrical contact above the second semiconductor die, where, the electrical contact is to make contact with a planar board that the semiconductor package is to mounted to.

A computing system has been described that includes: a) a plurality of processing cores; b) a memory controller coupled to the plurality of processing cores; c) a system memory coupled to the memory controller; and, d) a semiconductor die package comprising: i) a semiconductor die package substrate having a top side and a bottom side; I/O balls on the bottom side of the semiconductor die package substrate, where the I/O balls are to mount to a planar board; a first semiconductor die mounted on the bottom side of the semiconductor die package substrate, where, the first semiconductor die is vertically located between the bottom side of the semiconductor die package substrate and a second semiconductor die that is a part of the semiconductor die package.

In an embodiment the computing system further includes a third semiconductor die that is mounted to the top side of the semiconductor package substrate. In yet another embodiment the computing system further includes a direct electrical connection between the semiconductor package substrate and the second semiconductor die. In yet another embodiment, the computing system includes an electrical connection between the first and second semiconductor die. In yet another embodiment, the computing system includes a heat spreader structure to make contact with the planar board, where, the second semiconductor die is between the heat spreader structure and the first semiconductor die.

The invention claimed is:

1. An apparatus comprising:
    a semiconductor die package comprising:
        a semiconductor die package substrate having a top side and a bottom side;
        I/O balls on the bottom side of the semiconductor die package substrate, the I/O balls to mount to a planar board;
        a first semiconductor die mounted on the bottom side of the semiconductor die package substrate, the first semiconductor die vertically located between the bottom side of the semiconductor die package substrate and a second semiconductor die that is a part of the semiconductor die package, wherein a portion of the second semiconductor die extends beyond a periphery of the first semiconductor die.

2. The apparatus of claim 1 further comprising a third semiconductor die that is mounted to the top side of the semiconductor package substrate.

3. The apparatus of claim 1 wherein the first semiconductor die is mounted on the bottom side of the semiconductor package substrate with a land grid array.

4. The apparatus of claim 1 further comprising a direct electrical connection between the semiconductor package substrate and the second semiconductor die.

5. The apparatus of claim 4 wherein the direct electrical connection passes through the first semiconductor die.

6. The apparatus of claim 1 further comprising an I/O ball of the I/O balls that is in electrical and physical contact with said first and second semiconductor die.

7. The apparatus of claim 1 further comprising an electrical connection between said first and second semiconductor die.

8. The apparatus of claim 7 wherein said electrical connection is formed by a conductive plug located between said first and second semiconductor die.

9. The apparatus of claim 7 wherein said electrical connection runs though said semiconductor package substrate.

10. The apparatus of claim 1 further comprising a heat spreader structure to make contact with said planar board, said second semiconductor die between said heat spreader structure and said first semiconductor die.

11. The apparatus of claim 1 further comprising an electrical contact stemming from said second semiconductor die to make contact with said planar board, said second semiconductor die between said electrical contact and said first semiconductor die.

12. A method, comprising:
   placing first and second semiconductor die on an underside of a semiconductor package substrate such that said first semiconductor die is vertically located between said second semiconductor die and said underside of said semiconductor substrate, wherein a portion of the second semiconductor die extends beyond a periphery of the first semiconductor die.

13. The method of claim 12 wherein said first and second semiconductor die are part of a pre-fabricated structure that is mounted on said underside of said semiconductor package substrate.

14. The method of claim 12 wherein said first semiconductor die is mounted on said underside of said semiconductor package substrate and then said second semiconductor die is placed over said first semiconductor die.

15. The method of claim 12 further comprising forming an I/O ball of said semiconductor package that makes physical contact with said first and second semiconductor die.

16. The method of claim 12 further comprising forming a heat spreader over the second semiconductor die.

17. The method of claim 12 further comprising forming an electrical contact between the first and second semiconductor die that physical resides between the first and second semiconductor die.

18. The method of claim 12 further comprising forming an electrical contact above the second semiconductor die, the electrical contact to make contact with a planar board that the semiconductor package is to mounted to.

19. A computing system, comprising:
   a) a plurality of processing cores;
   b) a memory controller coupled to the plurality of processing cores;
   c) a system memory coupled to the memory controller;
   d) a semiconductor die package comprising: a semiconductor die package substrate having a top side and a bottom side;
   I/O balls on the bottom side of the semiconductor die package substrate, the I/O balls to mount to a planar board;
   a first semiconductor die mounted on the bottom side of the semiconductor die package substrate, the first semiconductor die vertically located between the bottom side of the semiconductor die package substrate and a second semiconductor die that is a part of the semiconductor die package, wherein a portion of the second semiconductor die extends beyond a periphery of the first semiconductor die.

20. The computing system of claim 19 further comprising a third semiconductor die that is mounted to the top side of the semiconductor package substrate.

21. The computing system of claim 19 further comprising a direct electrical connection between the semiconductor package substrate and the second semiconductor die.

22. The computing system of claim 19 further comprising an electrical connection between said first and second semiconductor die.

23. The apparatus of claim 19 further comprising a heat spreader structure to make contact with said planar board, said second semiconductor die between said heat spreader structure and said first semiconductor die.

* * * * *